US006797623B2

(12) United States Patent
Sato et al.

(10) Patent No.: US 6,797,623 B2
(45) Date of Patent: Sep. 28, 2004

(54) METHODS OF PRODUCING AND POLISHING SEMICONDUCTOR DEVICE AND POLISHING APPARATUS

(75) Inventors: Shuzo Sato, Kanagawa (JP); Yuji Segawa, Tokyo (JP); Akira Yoshio, Tokyo (JP); Hiizu Ootorii, Tokyo (JP); Zenya Yasuda, Kanagawa (JP); Masao Ishihara, Tokyo (JP); Takeshi Nogami, Kanagawa (JP); Naoki Komai, Kanagawa (JP)

(73) Assignee: Sony Corporation (JP)

( * ) Notice: Subject to any disclaimer, the term of this patent is extended or adjusted under 35 U.S.C. 154(b) by 187 days.

(21) Appl. No.: 09/800,580

(22) Filed: Mar. 8, 2001

(65) Prior Publication Data

US 2001/0036746 A1 Nov. 1, 2001

(30) Foreign Application Priority Data

| Mar. 9, 2000 | (JP) | ................................. P2000-071083 |
| Feb. 28, 2001 | (JP) | ................................. P2001-056038 |
| Feb. 28, 2001 | (JP) | ................................. P2001-056039 |

(51) Int. Cl.[7] .......................................... H01L 21/302
(52) U.S. Cl. ..................... 438/691; 438/692; 438/693
(58) Field of Search ................................ 438/626, 633, 438/669, 692, 754, 691, 693, 694; 205/640

(56) References Cited

U.S. PATENT DOCUMENTS

| 3,951,710 A | * | 4/1976 | Basi ........................... 438/471 |
| 5,242,343 A | * | 9/1993 | Miller ......................... 438/692 |
| 5,807,165 A | * | 9/1998 | Uzoh et al. .................... 451/41 |
| 5,904,859 A | * | 5/1999 | Degani ......................... 216/18 |
| 5,948,697 A | * | 9/1999 | Hata ........................... 438/692 |
| 5,963,040 A | * | 10/1999 | Liu ............................. 324/551 |
| 6,099,604 A | * | 8/2000 | Sandhu et al. .............. 438/692 |
| 6,149,781 A | * | 11/2000 | Forano ....................... 204/239 |
| 6,242,343 B1 | * | 6/2001 | Yamazaki et al. ............ 451/41 |
| 6,331,490 B1 | * | 12/2001 | Stevens et al. ............. 438/754 |
| 6,379,223 B1 | * | 4/2002 | Sun et al. ..................... 451/41 |
| 6,440,295 B1 | * | 8/2002 | Wang ......................... 205/640 |
| 6,447,563 B1 | * | 9/2002 | Mahulikar .................. 438/692 |

* cited by examiner

*Primary Examiner*—Lan Vinh
(74) *Attorney, Agent, or Firm*—Rader, Fishman & Grauer PLLC; Ronald P. Kananen

(57) ABSTRACT

A method of production and a method of polishing a semiconductor device and a polishing apparatus, capable of easily flattening an initial unevenness of a metal film, excellent in efficiency of removal of an excess metal film, and capable of suppressing damage to an interlayer insulation film below the metal film when flattening the metal film by polishing, the polishing method including the steps of interposing an electrolytic solution including a chelating agent between a cathode member and the copper film, applying a voltage between the cathode member used as a cathode and the copper film used as an anode to oxidize the surface of the copper film and forming a chelate film of the oxidized copper, selectively removing a projecting portion of the chelate film corresponding to the shape of the copper film to expose the projecting portion of the copper film at its surface, and repeating the above chelate film forming step and the above chelate film removing step until the projecting portion of the copper film is flattened.

26 Claims, 25 Drawing Sheets

FIG.22B PRESENT INVENTION

METHODS OF PRODUCING AND POLISHING SEMICONDUCTOR DEVICE AND POLISHING APPARATUS

BACKGROUND OF THE INVENTION

1. Field of the Invention

The present invention relates to methods and apparatus of producing and polishing a semiconductor device, more particularly relates to methods of producing and polishing a semiconductor device including a step of reducing surface unevenness accompanying the formation of a metal film, and to a polishing apparatus thereof.

2. Description of the Related Art

Along with the increase in integration and reduction of size of semiconductor devices, progress has been made in miniaturization of interconnections, reduction of interconnection pitch, and superposition of interconnections. The importance of the multilayer interconnection technology in the manufacturing process of semiconductor devices is therefore rising.

Aluminum has been frequently used as an interconnection material of a semiconductor device having a multilayer interconnection structure, but in order to reduce the propagation delay of signals in the recent 0.25 µm or less design rule, has been attempted active development of an interconnection process in that aluminum as the interconnection material is replaced by copper. When using copper for interconnections, it is beneficial that both a low resistance and a high electromigration tolerance can be obtained.

In a process using this copper for interconnections, for example, an interconnection process referred to as the damascene process for burying a metal in a groove-like interconnection pattern formed in an interlayer insulation film in advance and removing excess metal film by chemical mechanical (mechno-chemical) polishing (CMP) to form the interconnections has become influential. The damascene process has the features that etching of the interconnections become unnecessary and also a further upper interlayer insulation film becomes flat by itself, so the manufacturing steps can be simplified.

Further, by the dual damascene process, where not only grooves for the interconnections, but also the contact holes are formed as grooves in the interlayer insulation film and where the interconnections and the contact holes are simultaneously buried by the metal, a greater reduction of the interconnection steps can be achieved.

Here, an explanation will be made of an example of the process for forming copper interconnections by the dual damascene process with reference to the accompanying drawings.

First, as shown in FIG. 25A, for example, an interlayer insulation film 302 made of silicon oxide is formed by low pressure chemical vapor deposition (LP-CVD) on a silicon or other semiconductor substrate 301 on which a not illustrated impurity diffusion region is appropriately formed.

Next, as shown in FIG. 25B, contact holes CH communicating with the impurity diffusion region of the semiconductor substrate 301 and grooves M in which it will be formed a predetermined pattern of interconnections to be electrically connected to the impurity diffusion region of the substrate 301 which are formed by using well-known photolithography and etching.

Next, as shown in FIG. 25C, a barrier film 305 is formed on the surface of the interlayer insulation film 302 and in the contact holes CH and the grooves M. This barrier film 305 is formed by a material such as Ta, Ti, TaN, or TiN by well-known sputtering. When the interconnection material is copper and the interlayer insulation film 302 is silicon oxide, since copper has a large diffusion coefficient with respect to silicon oxide, it is easily oxidized. The barrier film 305 is provided to prevent this.

Next, as shown in FIG. 26A a seed copper film 306 is formed on the barrier film 305 to a predetermined thickness by well-known sputterings.

Then, as shown in FIG. 26B a copper film 307 is formed so as to bury the contact holes CH and the grooves M by copper. The copper film 307 is formed by the process of plating, CVD, sputtering, etc.

Next, as shown in FIG. 26C the excess copper film 307 and barrier film 305 on the interlayer insulation film 302 are removed by CMP for flattening.

Due to the above steps, copper interconnections 308 and contacts 309 are formed.

By repeating the above process on the interconnections 308, multilayer interconnections can be formed.

Summarizing the disadvantages to be solved by the invention, in the step of removing the excess copper film 307 by CMP in the copper interconnection forming process using the dual damascene process, because the flattening technique employing conventional CMP involves applying a predetermined pressure between a polishing tool and the copper film for polishing, it suffers from a large damage given to the semiconductor substrate. Especially in a case where an organic insulation film of a small dielectric constant having a low mechanical strength is adopted for the interlayer insulation film, this damage no longer becomes negligible and may cause cracks of the interlayer insulation film and separation of the interlayer insulation film from the semiconductor substrate.

Further, the removal performance differs among the interlayer insulation film 302, the copper film 307, and the barrier film 305, therefore it suffers from the disadvantage that dishing, erosion (thinning), recesses, etc. easily occur in the interconnections 308.

Dishing is a phenomenon where, as shown in FIG. 26, when there is an interconnection 308 having a width of for example about 100 µm at for example a 0.18 µm design rule, the center portion of the interconnection is excessively removed and sinks. If this dishing occurs, the sectional area of the interconnection 308 becomes insufficient. This causes poor interconnection resistance etc. This dishing is apt to occur when copper or aluminum, which is relatively soft, is used as the interconnection material.

Erosion is a phenomenon where, as shown in FIG. 27, a portion having a high pattern density such as where interconnections with a width of 1.0 µm are formed at a density of 50% in a range of for example 3000 µm is excessively removed. When erosion occurs, the sectional area of the interconnections becomes insufficient. This causes poor interconnection resistance etc.

Recess is a phenomenon where, as shown in FIG. 28, the interconnection 308 becomes lower in level at the interface between the interlayer insulation film 302 and the interconnection 308 resulting in a step difference. In this case as well, the sectional area of the interconnection becomes insufficient, causing poor interconnection resistance etc.

Further, in the step of flattening and removing the excess copper film 307 by CMP, it is necessary to efficiently remove the copper film. The amount removed per unit time, that is, the polishing rate, is required to be for example more than 500 nm/min.

In order to obtain this polishing rate, it is necessary to increase the polishing pressure on the wafer. When the polishing pressure is raised, as shown in FIG. 29, a scratch SC and chemical damage CD are apt to occur in the interconnection surface. In particular, they easily occur in the soft copper. For this reason, it causes opening of the interconnections, short-circuiting, poor interconnection resistance, and other defects. Further, if the polishing pressure is raised, there is the inconvenience that the amount of the scratches, separation of interlayer insulation film, dishing, erosion, and recesses also becomes larger.

SUMMARY OF THE INVENTION

A first object of the present invention is to provide a method of producing a semiconductor device capable of easily flattening an initial unevenness, excellent in efficiency of removal of an excess metal film, and capable of suppressing damage to an interlayer insulation film below a metal film when flattening the metal film by polishing; a second object of the present invention is to provide a method of polishing the same semiconductor device; a third object of the present invention is to provide a polishing apparatus using these methods.

An object of the present invention is to provide a method of production and a method of polishing a semiconductor device capable of easily flattening an initial unevenness, excellent in efficiency of removal of an excess metal film, and capable of suppressing damage to an interlayer insulation film below a metal film when flattening the metal film by polishing and to a polishing apparatus used for these methods.

To attain the above object, according to a first aspect of the present invention, there is provided a method of producing a semiconductor device, including the steps of forming an interconnection groove in an insulation film formed on a substrate, stacking a copper film having unevenness on its surface corresponding to the step difference of the interconnection groove on the entire surface of the insulation film so as to bury the interconnection groove, interposing an electrolytic solution including a chelating agent between a cathode member and the copper film, applying a voltage between the cathode member functioning as a cathode and the copper film functioning as an anode to oxidize the surface of the copper film and form a chelate film of oxidized copper, selectively removing a projecting portion of the chelate film corresponding to unevenness of the copper film to expose the copper film of that projecting portion at its surface, and repeating the chelate film forming step and the above chelate film removing step until the projecting portion of the copper film is flattened.

According to the above method for producing a semiconductor device, the uneven copper film surface formed when burying an interconnection groove by copper film is oxidized by anodic oxidation. This oxidized copper is chelated by a chelating agent in an electrolytic solution. Therefore, a chelate film of rather low mechanical strength able to be easily removed is formed. If removing a projecting portion of the chelate film, because the further exposed copper is chelated after being oxidized by anodic oxidation, flatness of the copper film is achievable by repeating the step of removing the projecting portion of the chelate film.

Since the resistance of the chelate film is higher than copper, the copper covered by the not removed chelate film remaining in the groove is hard to be oxidized by anodic oxidation by passing a current, so the chelation is very slow and the chelate film is formed by anodic oxidation only at the projecting portion of the copper exposed by the removal of the previous chelate film.

Further, because the current is supplied through an electrolytic solution, if the potential difference between the copper film on the anode and the cathode member of the cathode is constant, the current density becomes larger the shorter the distance between electrodes. Therefore, in the copper film exposed after removing the chelate film, the more projecting a part of the copper film is, the shorter the electrode distance to the cathode member used as the cathode and thus the higher the current density and consequently, the higher the speed of the anodic oxidation and the faster the chelation.

Accordingly, because of the accelerated chelation of the projecting portion of the copper film, it is able to achieve efficient flattening and suppression of damage to the interlayer insulation film below a copper film.

The method for producing a semiconductor device according to the present invention preferably further includes a step, after flattening the projecting portion of the copper film, of removing the chelate film formed on the surface of the copper film until removing the copper film stacked outside the interconnection groove.

Due to this, copper interconnections can be formed while suppressing damage to the interlayer insulation film below the copper film.

In the method for producing a semiconductor device according to the present invention, preferably, in the step of applying a voltage by using the cathode member as a cathode, a voltage is applied using as a cathode a conductive polishing tool for removing a projecting portion of the chelate film.

By using a polishing tool as the cathode, efficient chelation due to the anodic oxidation and efficient removal of the chelate film can be obtained.

In the method for producing a semiconductor device according to the present invention, preferably, in the step of applying a voltage by using the copper film as the anode, a voltage is applied on an anode member contacting or close to the copper film, making the copper film an anode through the electrolytic solution.

By locally passing a current from the anode member to the copper film through the electrolytic solution, a stable current can be supplied.

In this case, a current is supplied to the copper film from the anode member via the electrolytic solution and, further, from the copper film to the cathode member through the electrolytic solution, so the copper film near the cathode member is oxidized and chelated.

In the method for producing a semiconductor device according to the present invention, preferably, in the step of applying a voltage by using the cathode member as a cathode, a voltage is applied using a conductive electrode plate arranged parallel with the copper film as a cathode.

By arranging the electrode plate parallel with the copper film, as shown above, in the exposed copper films, the more projecting the portion, the shorter the electrode distance. Due to the increase of the speed of the anodic oxidation caused by the increased current density, the chelation is accelerated, so efficient flattening is achievable.

In the method for producing a semiconductor device according to the present invention, preferably, in the step of removing the chelate film, the chelate film is removed by wiping or mechanical polishing.

Since the chelate film has a rather low mechanical strength, mechanical polishing involving strong pressing is not necessary. It can be easily removed by wiping or mechanical polishing involving only weak pressing.

In the method for producing a semiconductor device according to the present invention, preferably, in the step of removing the chelate film, the chelate film is removed by applying vibration to the substrate. Alternatively, in the step of removing the chelate film, the chelate film is removed by flushing with the electrolytic solution.

Since the chelate film has a rather low mechanical strength, it can be easily removed not only by mechanical polishing, but also by vibration and the flushing action of the electrolytic solution.

In the method for producing a semiconductor device according to the present invention, preferably, in the chelate film forming step and the chelate film removing step, a current flowing through the cathode member and the copper film is monitored and the polishing process of the copper film is controlled in response to the magnitude of the current.

For example, by using a chelating agent forming a chelate film having a higher electrical resistance than the copper film, before the projecting portion is flattened, the current between the cathode member and the copper film increases when the projecting chelate film is removed because copper is exposed. When a chelate film is formed on the exposed copper again, the value of the current decreases. This cycle is repeated. When the copper film is flattened, because the chelate film on the copper film is removed completely and the copper film is exposed totally, the current reaches a maximum first, then the current value exhibits a new maximum at each removal.

When the barrier film is exposed, since usually the resistance of the barrier film is higher than copper, the current value begins to decrease after the chelate film is removed. Therefore, if stopping the application of voltage at the time when the current value begins to decrease, the formation of the chelate film by the anodic oxidation can be stopped after that time, thus the progress of the polishing can be controlled.

In addition, to achieve the above object, according to a second aspect of the present invention, there is provided a polishing method for polishing an object having a copper film on the surface to be polished, including the steps of interposing an electrolytic solution including a chelating agent between a cathode member and the polished surface, applying a voltage between the cathode member functioning as a cathode and the polished surface functioning as an anode to oxidize the surface of the copper film and form a chelate film of an oxidized copper film, selectively removing a projecting portion of the chelate film corresponding to the shape of the copper film to expose the copper film of that projecting portion at its surface, and repeating the above chelate film forming step and the chelate film removing step until the projecting portion of the copper film is flattened.

According to the polishing method of the present invention for polishing an object having a copper film on the surface to be polished, by interposing an electrolytic solution including a chelating agent between a cathode member and the polished surface and applying a voltage between the cathode member used as a cathode and the polished surface of the polished object used as an anode, the uneven copper surface is oxidized by the anodic oxidation. This oxidized copper is chelated by the chelating agent in the electrolytic solution, forming a chelate film of rather low mechanical strength thus able to be removed easily. If selectively removing a projecting portion of the chelate film, because the copper further exposed thereby is chelated after being oxidized by the anodic oxidation, flatness of the copper film is achievable by repeating the step of selectively removing the projecting portion of the chelate film.

Since the resistance of the chelate film is higher than copper, the copper covered by the unmoved chelate film remaining in the groove is hard to be oxidized by the anodic oxidation by supplying a current, so the chelation is very slow and a chelate film is formed by the anodic oxidation only at the projecting portion of copper exposed by removing the chelate film.

Further, because the current is supplied through an electrolytic solution, if the potential difference between the copper film on the anode and the cathode member of the cathode is constant, the current density becomes larger the shorter the distance between electrodes. Therefore, in the copper film exposed after removing the chelate film, the more projecting a part of the copper film is, the shorter the electrode distance to the cathode member used as the cathode and thus the higher the current density and consequently, the higher the speed of the anodic oxidation and the faster the chelation.

Accordingly, because of the accelerated chelation of the projecting portion of the copper film, it is possible to achieve efficient flattening and suppression of damage to an interlayer insulation film below a copper film.

In addition, to achieve the above object, according to a third aspect of the present invention, there is provided a method for production of a semiconductor device, including the steps of forming at least a groove or hole in an insulation film formed on a substrate, stacking a metal film on the insulation film so as to bury the groove or hole, interposing an electrolytic solution between a cathode member and the metal film, applying a predetermined voltage between the cathode member used as a cathode and the metal film used as an anode, removing the surface of the metal film, and repeating the above step of removing the metal film until the unevenness of the surface of the metal film is reduced.

Further, the method for producing a semiconductor device of the present invention further includes a step of forming a barrier film for preventing diffusion of the metal film to the insulation film on the insulation film so as to bury the groove or hole after forming the groove or hole in the insulation film and before stacking the metal film on the insulation film, wherein the metal film is stacked on the barrier film in the step of stacking the metal film on the insulation film.

Further, in the step of removing the surface of the metal film, the step of copper film removal is repeated until the metal film stacked outside the groove or hole is removed.

According to the above method for producing a semiconductor device, when processing the surface of a metal film buried in a groove or hole, by interposing an electrolytic solution between a cathode member and the metal film and applying a predetermined voltage between the cathode member used as a cathode and the metal film used as an anode, the metal film is oxidized by the anodic oxidation, ionized in a state of metallic ions, and has a very low mechanical strength enabling it to be easily removed. If removing the oxidized metal film, the further exposed metal film is oxidized by the anodic oxidation again. By repeating the step of removing the metal film after the anodic oxidation, the step difference of the metal film can be reduced.

Further, because current is supplied through an electrolytic solution, if the potential difference between the metal film of the anode and the cathode member of the cathode is constant, the current density becomes larger the shorter the distance between electrodes. Therefore, in the copper film exposed after removing the chelate film, the more projecting the copper film is, the shorter the electrode distance to the cathode member used as the cathode and thus the higher the current density. Consequently, the anodic oxidation of the projecting portion of the metal film is accelerated, the step difference of the metal film surface can be efficiently reduced, and the damage to the insulation film below the metal film can be suppressed.

In addition, to achieve the above object, according to a fourth aspect of the present invention, there is provided a polishing apparatus for polishing an object having a copper film on the surface to be polished, comprising a polishing tool having a polishing surface and having conductivity, a polishing tool rotating and holding means for rotating the polishing tool about a predetermined axis of rotation and holding the same, a rotating and holding means for holding a polishing object and rotating the same about a predetermined axis of rotation, a moving and positioning means for moving and positioning the polishing tool to a target position in a direction facing the polishing object, a relative moving means for making the polished surface of the polishing object and the polishing surface of the polishing tool relatively move along a predetermined plane, an electrolytic solution feeding means for feeding an electrolytic solution including a chelating agent onto the polished surface, and a current supplying means for supplying an electrolytic current flowing through the polishing tool through the electrolytic solution from the polished surface by using the polished surface as an anode and the polishing tool as a cathode.

According to the polishing apparatus of the present invention, for example, if a copper film with unevenness is formed on a polished surface of the object to be polished, the polished surface of the copper film is oxidized by the anodic oxidation by the current supplying means. This oxidized copper is chelated by a chelating agent in an electrolytic solution fed by the electrolytic solution feeding means. A chelate film of a rather low mechanical strength and able to be easily removed is thus formed.

The moving and positioning means brings the polishing surface into contact or proximity with the polished surface. The polishing tool rotating and holding means rotates the polishing surface and the polished surface in a state in contact or proximity with each other. Therefore, the projecting portion of a chelate film is removed. Further, by the relative moving means, projecting portions of the chelate film on the entire polished surface are polished and removed, therefore the polished surface can be polished efficiently at a low polishing pressure.

In the polishing apparatus of the present invention, preferably the electrolytic current supplying means comprises an anode member arranged to be able to be brought into contact or proximity with the polished surface and supply current to the polished surface using the polished surface as an anode and a DC power supply supplying a predetermined DC power between the anode member means and the polishing tool.

By locally passing a current from the anode member to the copper film through the electrolytic solution, a stable current can be supplied.

In this case, a current is supplied to the copper film from the anode member via the electrolytic solution and further from the copper film to the cathode member through the electrolytic solution, so the copper film near the polishing tool serving as a cathode is oxidized and chelated.

In the polishing apparatus according to the present invention, preferably the DC power supply outputs a pulse-like voltage of a predetermined period.

For example, setting the pulse width extremely short is effective for making the amount of the chelate film formed by the anodic oxidation per pulse very small, preventing sudden, huge anode oxidation of the copper film due to discharge due to a sudden change of the distance between electrodes in a case of contact with unevenness of the surface or the like, spark discharge due to a sudden change of electrical resistance occurring when air bubbles, particles, or the like are interposed, etc. and achieving continuity of amounts as small as possible.

In the polishing apparatus according to the present invention, preferably the anode member comprises a metal more precious than copper formed on the polished surface. Due to this, elution of the anode member to the electrolytic solution can be prevented, and the copper film can be actively oxidized by the anodic oxidation. Note since the cathode is essentially not eluted, it is not necessary to consider the preciousness of the cathode.

The polishing apparatus according to the present invention preferably further comprises a current detecting means for detecting a value of a current flowing from the polished surface to the polishing tool, more preferably further comprises a control means for controlling a position of the polishing tool in a direction substantially perpendicular with the polished surface so that the value of the current becomes constant on the basis of a detection signal of the current detecting means.

By control to make the current value constant, the current density becomes constant constantly and thereby the amount of the chelate film formed by the anode oxidation can be controlled constant.

In addition, to achieve the above object, according to a fifth aspect of the present invention, there is provided a polishing apparatus which comprises a polishing tool having a polishing surface in contact with the entire surface of the polished surface of the polishing object while rotating it and which brings the polishing object into contact with the polished surface while rotating it so as to flatten and polish the same, the polishing apparatus comprising an electrolytic solution feeding means for feeding an electrolytic solution including a chelating agent onto the polishing surface and an anode electrode and a cathode electrode capable of supplying electric power in the polishing surface and flattening the polished surface by electrolytic composite polishing which combines electrolytic polishing by the electrolytic solution and mechanical polishing by the polishing surface.

According to the polishing apparatus of the present invention, for example, by applying a voltage to the anode and cathode provided on the polishing surface, a current is supplied to the copper film on the polished surface from the anode member on the polishing surface via the electrolytic solution and furthermore from the copper film to the cathode on the polishing surface through the electrolytic solution, so the copper film of the polished surface near the cathode is oxidized.

This oxidized copper is chelated by the chelating agent in the electrolytic solution fed by the electrolytic solution feeding means, whereby a chelate film of a rather low mechanical strength able to be easily removed is formed.

By rotating the polishing surface and the polished surface respectively in a state contacting each other entirely or brought close to each other entirely, projecting portions of the chelate film on the entire polished surface are polished and removed, therefore the polished surface can be polished efficiently with a low polishing pressure.

In addition, to achieve the above object, according to a sixth aspect of the present invention, there is provided a polishing apparatus for polishing an object having a copper film on the surface to be polished, comprising a holding means for holding the object to be polished, an electrode plate arranged parallel with the polished surface, a vibration applying means for applying vibration on the polished object, an electrolytic solution feeding means for feeding an electrolytic solution including a chelating agent between the polished surface and the electrode plate, and an electrolytic current supplying means for supplying an electrolytic current flowing through the electrolytic solution from the polished surface to the electrode plate by using the polished surface as an anode and the electrode as a cathode.

According to the polishing apparatus of the present invention, for example, if a copper film with unevenness is formed on the polished surface, the polished surface of the copper film is oxidized by the anodic oxidation by the current supplying means. This oxidized copper is chelated by the chelating agent in the electrolytic solution fed by the electrolytic solution feeding means, whereby a chelate film of a rather low mechanical strength able to be easily removed is formed.

The projecting portions of the chelate film are selectively removed by the vibration action on the polished object by the vibration applying means. This enables efficient polishing causing little damage to the polished object.

The polishing apparatus according to the present invention preferably further comprises a current detecting means for detecting a value of a current flowing from the polished surface to the polishing tool. Thereby the electrolytic current can be monitored and the polishing process controlled, so it becomes possible to correctly grasp the state of progress of the polishing process.

In addition, to achieve the above object, according to a seventh aspect of the present invention, there is provided a polishing apparatus for polishing an object having a copper film on the surface to be polished, comprising a holding means for holding the polished object, an electrode plate arranged parallel with the polished surface, an electrolytic solution feeding means for feeding an electrolytic solution including a chelating agent between the polished surface and the electrode plate, an electrolytic current supplying means for supplying an electrolytic current flowing through the electrolytic solution from the polished surface to the electrode plate by using the polished surface as an anode and the electrode as a cathode, and a flushing means for flushing the electrolytic solution between the polished surface and the electrode plate.

According to the polishing apparatus of the present invention, for example, if a copper film with unevenness is formed on the polished surface of the object to be polished, the polished surface of the copper film is oxidized by the anodic oxidation by the current supplying means. This oxidized copper at an anode is chelated by the chelating agent in the electrolytic solution fed by the electrolytic solution feeding means, whereby a chelate film of a rather low mechanical strength able to be easily removed is formed.

The projecting portions of the chelate film are selectively removed by a vibration action on the polished object by the vibration applying means. This enables efficient polishing causing little damage to the polished object.

The polishing apparatus according to the present invention preferably further comprises a current detecting means for detecting a value of a current flowing from the polished surface to the polishing tool. Therefore, the electrolytic current can be monitored and the polishing process controlled, so it becomes possible to correctly grasp the state of progress of the polishing process.

In addition, to achieve the above object, according to an eighth aspect of the present invention, there is provided a polishing apparatus for polishing an object having a metal film on the surface to be polished, comprising a holding means for holding the polished object, a wiper for wiping the surface of the polished object, an electrolytic solution feeding means for feeding an electrolytic solution on the surface of the polished object, a facing electrode arranged at a position facing the surface of the polished object, and a current supplying means for supplying a current between the surface of the polished object and the facing electrode.

In addition, to achieve the above object, according to a ninth aspect of the present invention, there is provided a polishing apparatus for polishing an object having a metal film on the surface to be polished, comprising a holding means for holding the polished object, a wiper for wiping the surface of the polished object, a relative moving means for relatively moving the surface of the polishing object and the wiper, an electrolytic solution feeding means for feeding an electrolytic solution on the surface of the polished object, a facing electrode arranged at a position facing the surface of the polished object, and a current supplying means for supplying a current between the surface of the polished object and the facing electrode.

The relative moving means presses the wiper on the surface of the polished object and rotates the wiper relative to a predetermined center axis of rotation.

Alternatively, the relative moving means presses the wiper against the surface of the polished object and horizontally moves the wiper in the surface of the polished object.

Alternatively, the relative moving means rotates the holding means relative to a predetermined center axis of rotation.

Alternatively, the relative moving means horizontally moves the holding means in a surface parallel with the surface of the wiper.

According to the above polishing apparatuses according to the present invention, for example, when a metal film is formed on the polished surface of the polishing object, an electrolytic solution is fed onto the surface of the polishing object by the electrolytic solution feeding means, and a current is supplied between the surface of the polishing object and the facing electrode by the current supplying means, so the metal film is oxidized by the anodic oxidation, ionized into a state of metallic ions, and has a very low mechanical strength enabling it to be easily removed.

Further, by wiping the surface of the oxidized metal film using a wiper, the oxidized metal is removed, therefore, the polishing object can be polished efficiently even at a low pressure.

BRIEF DESCRIPTION OF THE DRAWINGS

The above object and features of the present invention will be more apparent from the following description of the preferred embodiments given with reference to the accompanying drawings, wherein:

FIG. 1A shows the step for forming an insulation film on a semiconductor substrate, FIG. 1B shows the step for forming contact holes and interconnection grooves, and FIG. 1C shows the step for forming a barrier film;

FIG. 2A shows the step of forming a copper film as a seed film, while FIG. 2B shows the step of forming a copper film;

FIG. 3A shows the step of anodic oxidation of the copper film, while FIG. 3B shows the step of forming a chelate film;

FIG. 4A shows the step of removing projecting portions of the chelate film, while FIG. 4B shows the step of re-forming a chelate film;

FIG. 5A shows the step of flattening the copper film, FIG. 5B shows the step of removing excess copper film, and FIG. 5C shows the step of exposing the barrier film;

FIG. 8A is a bottom view of an electrode plate used in a polishing apparatus according to the first embodiment of the present invention, while

FIG. 22A and FIG. 22B shows measurement results in a fifth embodiment;

FIG. 25A shows the step of forming an insulation film, FIG. 25B shows the step of forming contact holes and interconnection grooves, and FIG. 25C shows the step of forming a barrier film;

FIG. 26A shows the step of forming a seed film, FIG. 26B shows the step of forming an interconnection layer, and FIG. 26C shows the step of forming interconnections;

DESCRIPTION OF THE PREFERRED EMBODIMENTS

Figure 1A:
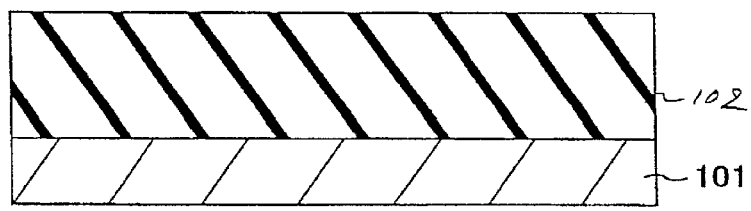
FIG. 1A to 1C are sectional views of the steps of the method of production of a semiconductor device of the present invention, where

Below, a description will be made of preferred embodiments of a method for producing and a method of polishing a semiconductor device and a polishing apparatus of the present invention by referring to the drawings.

First Embodiment

A description will be made of embodiments of the present invention by taking as an example the case where the present invention is applied to a process of formation of metal interconnections by a dual damascene process in a method of production of a semiconductor device.

Polishing Method

First, as shown in FIG. 1A, for example an interlayer insulation film 102 made of for example a silicon oxide film (SiO$_2$) is formed by a low pressure chemical vapor deposition (LP-CVD) process by using for example tetraethyl orthosilicate (TEOS) as the reaction source on a silicon or other semiconductor substrate 101 on which a not illustrated impurity diffusion region or an interconnection is suitably formed.

Note that as the interlayer insulation film 102, use can be made of a so-called low-k (low dielectric constant) material, in addition to a TEOS (tetraethyl orthosilicate) film and a silicon nitride film formed by a CVD process.

Here, the low dielectric constant materials include SiF, SiOCH, polyarylether, porous silica, or polyimide.

Figure 1B:
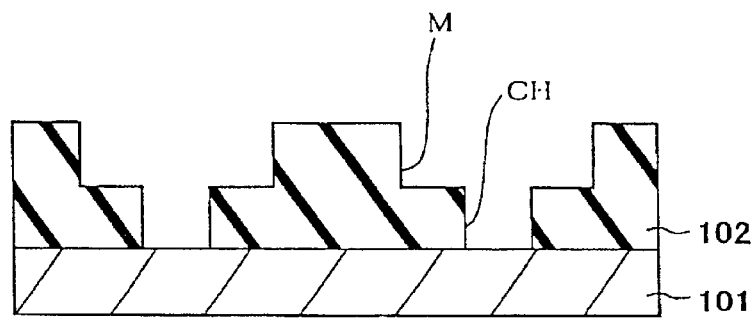

Next, as shown in FIG. 1B, contact holes CH communicating with the impurity diffusion region of the semiconductor substrate 101 and interconnection grooves M are formed by using well-known photolithography and etching. Note that the depth of the interconnection use grooves M is for example about 800 nm.

Figure 1C:
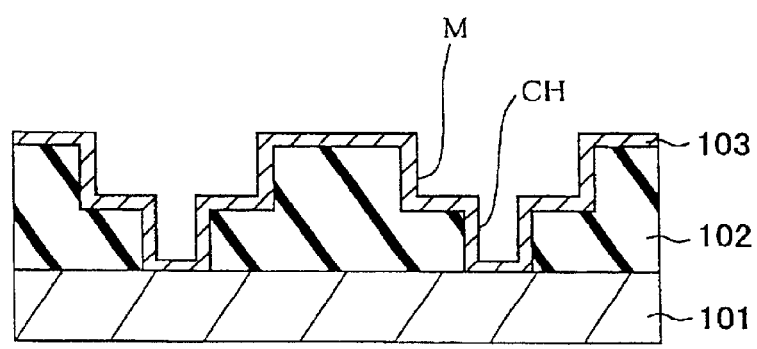

Next, as shown in FIG. 1C, a barrier film 103 is formed on the surface of the interlayer insulation film 102 and in the contact holes CH and the interconnection grooves M. This barrier film 103 is formed by a material such as Ta, Ti, W, Co, Si, Ni, an alloy of compounds of these metals with nitrogen or phosphor such as TaN, TiN, WN, CoW, COWP, TiSiN, NiWp, or others, or a stack of films comprised of these materials. A barrier film comprised of these material is fabricated to a thickness of for example about 25 nm by physical vapor deposition (PVD) or CVD using a well-known sputtering system, a vacuum vapor deposition system, or the like.

The barrier film 103 is provided in order to prevent the diffusion of the material comprising the interconnections into the interlayer insulation film 102 and to increase the adhesion with the interlayer insulation film 102. Particularly, as in the present embodiment, when the interconnection material is copper and the interlayer insulation film 102 is silicon oxide, since copper has a large diffusion coefficient as compared in a silicon oxide film, it can be easily oxidized. This should be prevented.

Figure 2A:
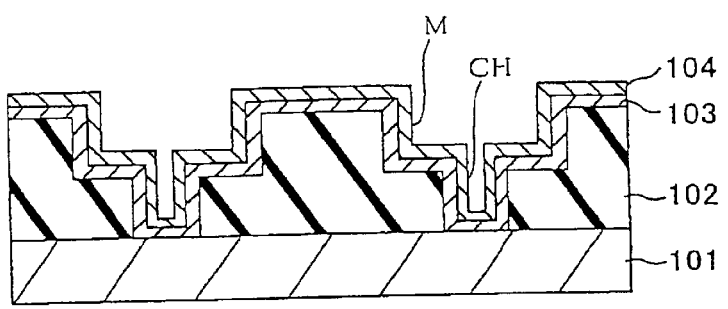
FIGS. 2A and 2B are views of the steps continuing from FIG. 1A to 1C, where
Figure 2B:
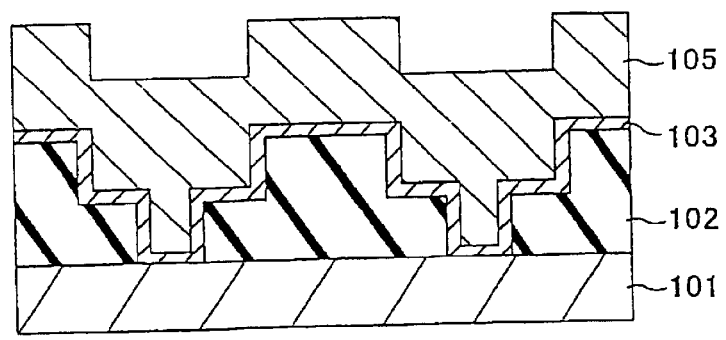

Next, as shown in FIG. 2D, a seed film 104 made of a material the same as the material for forming the copper interconnections is formed on the barrier film 103 to a thickness of for example about 150 nm by well-known sputtering. The seed film 104 is formed for later electroplating. For example, it is formed so as to accelerate the growth of metal grains when burying the interconnection grooves and the contact holes with a metal.

Next, as shown in FIG. 2E, an interconnection layer 105 made of Al, W, WN, Cu, Au, or Ag, or an alloy film of these metals, is formed on the barrier film 103 to a thickness of for example about 1600 nm so as to bury the contact holes CH and the interconnection grooves M. The interconnection layer 105 is preferably formed by electroplating or electroless plating, but it is also possible to form the interconnection layer 105 by CVD, PVD, sputtering, or the like. Note that the seed film 104 is integrally formed with the interconnection layer 105.

Due to the burying of the contact holes CH and the interconnection grooves M, unevenness having a height of for example about 800 nm is caused on the surface of the interconnection layer 105.

Below, an explanation is made for example of a case where copper is stacked as the interconnection layer.

The above process is carried out in a way similar to the related art, but in the polishing method of the present invention, the excess metal film 103 present on the interlayer insulation film 102 is removed by not chemical mechanical polishing, but electrolytic composite polishing using an electrolytic action. Specifically, the copper film is oxidized by the anodic oxidation, and a chelate film is formed on the surface thereof.

Figure 3A:
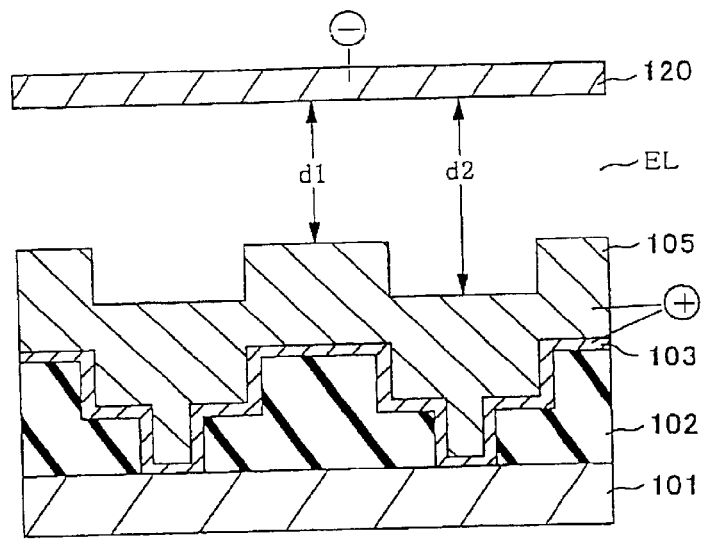
FIGS. 3A and 3B are views of the steps continuing from FIGS. 2A and 2B where
Figure 3B:
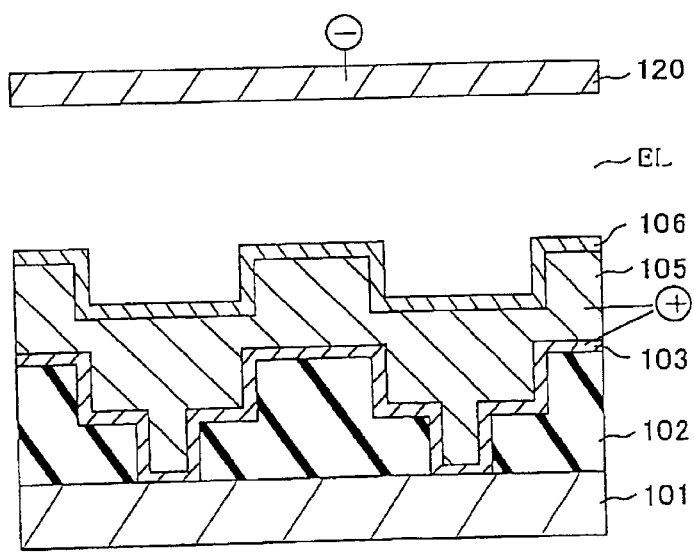

The method for forming the chelate film, as shown in FIG. 3F, includes the steps of arranging a cathode member 120 parallel with the copper film 105 and interposing an electrolytic solution EL including a chelating agent for chelating copper as an electrolyte or an additive between the cathode member 120 and the copper film 105. Note that starting from FIG. 4, the cathode member 120 and the electrolytic solution EL are not shown in the figures.

Further, a brightener, copper ions, etc. can be added to an electrolytic solution in addition to the above additives.

The temperature of the electrolytic solution EL is controlled, and the degree of oxidation of the surface of the metal film, chelating film formation, and wiping are optimized.

Here, as the chelating agent, use may be made of for example quinaldine acid of chemical formula (1), glycin of chemical formula (2), citric acid of chemical formula (3), oxalic acid of chemical formula (4), propionic acid of chemical formula (5), and so on.

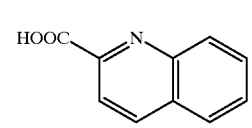

(1)

(2)

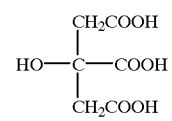

(3)

(COOH)$_2$ (4)

C$_2$H$_5$COOH (5)

The copper film 105 serving as the anode forms CuO by anodic oxidation. Here, the distance d1 between a projecting portion on the surface of the copper film 105 and the cathode member 120 is shorter than the distance d2 between a recessed portion on the surface of the copper film 105 and the cathode member 120, so when the potential difference between the cathode member 120 and the copper film 105 is constant, the current density at the projecting portion is greater than that at the recessed portion, therefore, the anodic oxidation is accelerated.

As shown in FIG. 3G, the surface of the oxidized copper film (CuO) 105 is chelated by the chelating agent in the electrolytic solution. When quinaldine acid is used as the chelating agent, a film made from a chelated compound of the chemical formula (6) is formed. When glycin is used, a film made from a chelate compound of the chemical formula (7) is formed. Any of these chelate films 106 has an electric resistance higher than copper and a very low mechanical strength. Accordingly, after a chelate film 106 is formed on the copper film 105, the value of the current from the copper film 105 to the cathode member 120 via the electrolytic solution EL decreases. Before the anodic oxidation, copper chelation is suppressed.

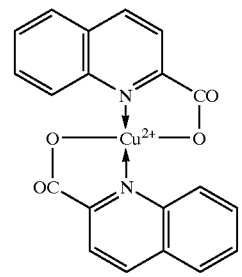

(6)

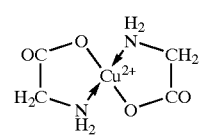

(7)

Figure 4A:
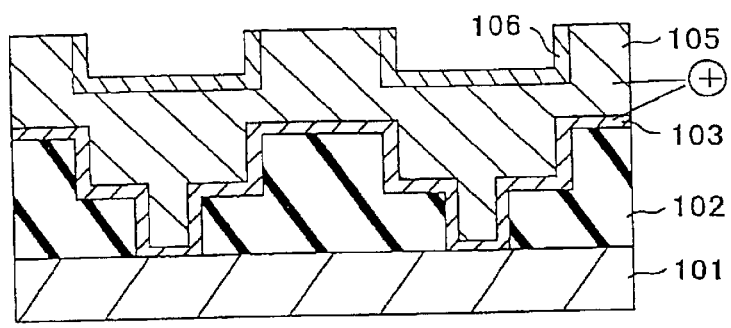
FIGS. 4A and 4B are views of the steps continuing from FIGS. 3A and 3B, where
Figure 4B:
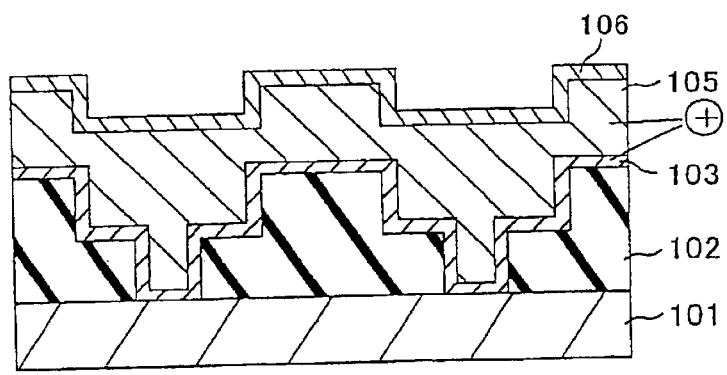

Next, as shown in FIG. 4H, when the projecting portions of the chelate film 106 formed on the surface of the copper film 105 are removed by wiping, mechanical polishing, etc., the electrolytic solution EL may also include a not shown slurry. Further, because the mechanical strength of the chelate film 106 is very low, it can be easily removed even by applying vibration to the substrate 101 or by jetting the electrolytic solution.

Because the projecting portion of the copper film 105 of the low electric resistance is exposed in the electrolytic solution at that time, the value of the current flowing from the copper film 105 to the cathode member 120 via the electrolytic solution EL rises.

Next, as shown in FIG. 4I, because of the low electric resistance and short distance to the cathode 120, the projecting portion of the copper film 105 exposed in the electrolytic solution is intensively oxidized by the anodic oxidation and the oxidized copper is chelated. Then, the current flowing from the copper film 105 to the cathode member 120 via the electrolytic solution EL decreases again.

After that, the projecting portions of the chelate film 106 are selectively removed by the previously mentioned wiping, mechanical polishing, etc., the exposed copper film 105 is intensively oxidized and chelated, and the projecting portions of the chelate film 106 are selectively removed. These steps are repeated. In this process, the current from the copper film 105 flowing to the cathode member 120 via the electrolytic solution EL rises and falls together with removal and formation of the chelate film 106, respectively.

Figure 5A:
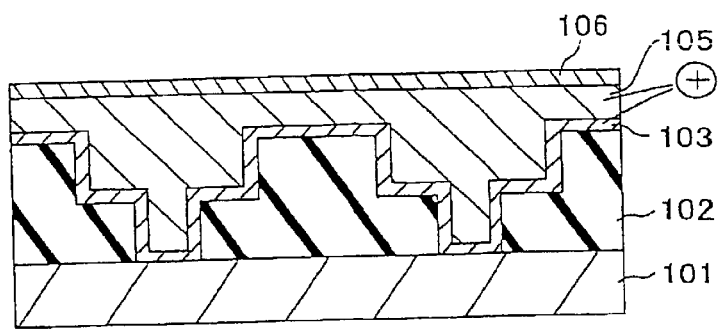
FIG. 5A to 5C are views of the steps continued from FIGS. 4A and 4B, where
Figure 5B:
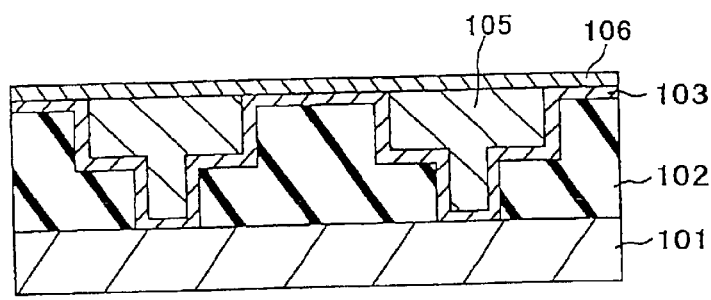
Figure 5C:
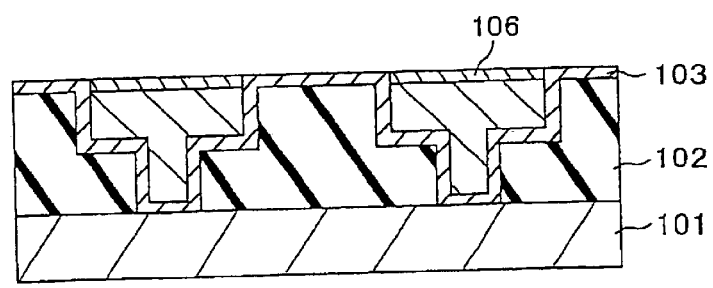

Next, as shown in FIG. 5J, after the above step, the copper film 105 is flattened. The flattened copper film 105 is removed from the entire surface by wiping, mechanical polishing, etc., whereby the current flowing from the copper film 105 to the cathode member 120 via the electrolytic solution EL reaches its maximum once during this process.

Next, as shown in FIG. 5K, the chelate film formed by anodic oxidation on the entire surface of the flattened copper film 105 continues to be removed until the excess copper film 105 on the barrier film 103 disappears completely.

Next as shown in FIG. 5L, the entire copper film 105 is removed by for example the aforethe wiping, mechanical polishing, etc. to expose the surface of the barrier film 103. At this time, as the barrier film 103 has a higher electric resistance than the copper film 105, the current starts to decline after the removal of the chelate film 106. At the time of starting to decline (near the end), the applied current is reduced first, then the application of current is stopped to stop the chelation due to the anodic oxidation. The processes up to here complete the flattening of the initial unevenness of the surface of the copper film 105.

Next, the barrier film 103 stacked outside the interconnection grooves is removed, whereby the copper interconnections are formed.

According to the polishing method according to the present embodiment, since the polishing rate of the polishing is assisted electrochemically assisted, the polishing is possible at a low polishing pressure compared with conventional chemical mechanical polishing. Even in comparison with simple mechanical polishing, this is highly advantageous in reducing scratches, reducing step differences, reducing dishing and erosion, etc.

Further, since the polishing is possible at a low pressure, it is extremely useful in a case where an organic film of a low dielectric constant or a porous insulation film of a low dielectric constant, which have low mechanical strengths and are easily broken by conventional chemical mechanical polishing, is used for the interlayer insulation film 102.

In the chemical mechanical polishing of the related art, when using a slurry containing alumina particles etc., the alumina particles may remain without wear after contributing to the CMP process or they may be buried in the surface of the copper (particle). In the polishing method of the present invention, however, since the chelate film formed on the surface has a very low mechanical strength, it can be removed effectively even by mechanical polishing or wiping using a chelating agent not containing a polishing abrasive as the electrolytic solution.

Further, by monitoring the electrolytic current, the polishing process can be controlled, so it becomes possible to correctly grasp the state of progress of the polishing process.

The polishing method according to the present invention is not limited to the above embodiment. As described above, it can also be applied to interconnections comprised of, for example, Al, W, WN, Cu, Au, or Ag, or an alloy film of these metals, in addition to copper. It can also be applied to polishing of a barrier film comprised of the above materials.

Further, the polishing method according to the present invention can also be applied to polishing of numerous metal films used for other than interconnections.

Further, various modifications can be made to the type of the chelating agent, the type of the cathode member, and so on without departing from the basic concept of the present invention.

Further, numerous modifications can be made without departing from the basic concept and scope of the invention, such as the type of the chelating agent, the type of the cathode member, and so on.

Further, the method for producing a semiconductor device is not limited to the above embodiment either. For example, the method of polishing a metal film is not limited in any way. In the present embodiment, a dual damascene process was explained as an example, but the present invention is also applicable to a single damascene process. In addition, numerous modifications can also be made without departing from the basic concept and scope of the invention in, such as, methods for fabricating contact holes or interconnection grooves and methods for fabricating a copper film and a barrier film.

Configuration of Polishing Apparatus

Figure 6:
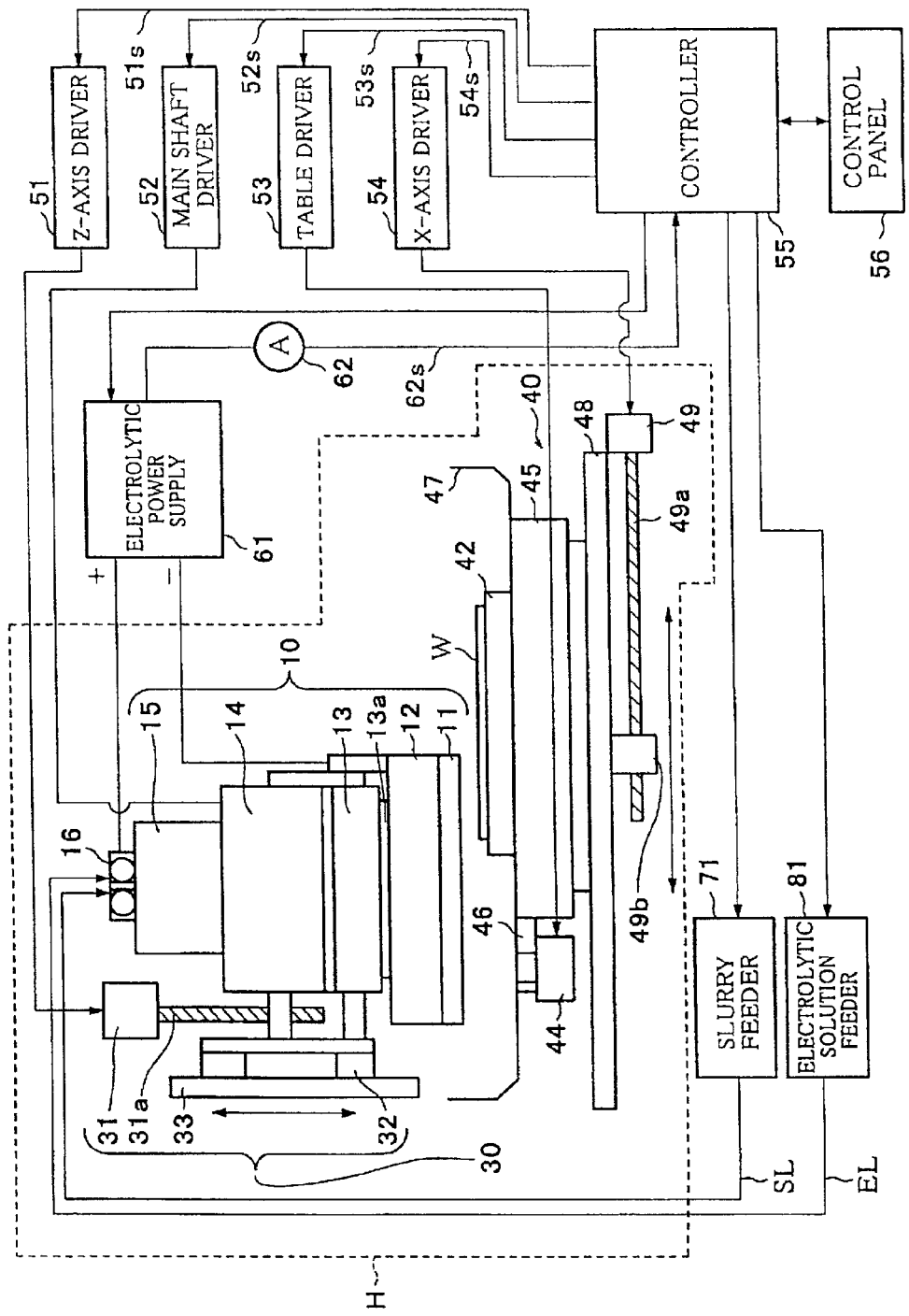
FIG. 6 is a view of the configuration of a polishing apparatus according to a first embodiment of the present invention.

FIG. 6 is a view of the configuration of a polishing apparatus according to an embodiment of the present invention.

The polishing apparatus shown in FIG. 6 is provided with a polishing head H, an electrolytic power supply 61, a controller 55 having a function of controlling the entire polishing apparatus, a slurry feeder 71, and an electrolytic solution feeder 81.

Note that, although not illustrated, the polishing apparatus is installed in a clean room, and a loading/unloading port for loading and unloading a wafer cassette storing wafers serving as the polishing objects in or out of the clean room is provided in the clean room. Further, a wafer conveyance robot for transferring the wafer between the wafer cassette loaded in the clean room through this loading/unloading port and the polishing apparatus is arranged between the loading/unloading port and the polishing apparatus.

The polishing head H is provided with a polishing tool holder 10 (a polishing tool rotating and holding means) for holding and rotating the polishing tool 11, a Z-axis positioning mechanism 30 (a moving and positioning means) for positioning the polishing tool holder 10 to a target position in the Z-axial direction, and an X-axis movement mechanism 40 (a rotating and holding means and a relative moving means) for holding and rotating a wafer as the polishing object and moving it in the X-axial direction.

The Z-axis positioning mechanism 30 has a Z-axis servo motor 31 fixed to a not illustrated column, a ball screw shaft 31a connected to the Z-axis servo motor 31, a Z-axis slider 32 which is connected to a holder 33 and a main shaft motor 14 and formed with a screw portion screwed into the ball screw shaft 31a, and a guide rail 33 arranged in a not illustrated column for holding the Z-axis slider 32 so that it can freely move in the Z-axial direction.

The Z-axis servomotor 31 is supplied with a drive current from a Z-axis driver 51 connected to the Z-axis servomotor 31 to be driven to rotate. The ball screw shaft 31a is provided along the Z-axial direction, with one end of it connected to the Z-axis servo motor 31 and with the other end rotatably held by the holding member provided in the not illustrated column, and is screwed into the screw portion of the Z-axis slider 32 between the ends.

Due to the above configuration, by being driven by the Z-axis servo motor 31, the ball screw shaft 31a is rotated. The polishing tool 11 held at the polishing tool holder 10 is moved and positioned via the Z-axis slider 32 to any position in the Z-axial direction. The positioning precision of the Z-axis positioning mechanism 30 is set at a resolution of about 0.1 $\mu$m.

The X-axis movement mechanism 40 has a wafer table 42 for chucking the wafer W, a holder 45 for rotatably holding the wafer table 42, a drive motor 44 for supplying a drive force for rotating the wafer table 42, a belt 46 for connecting the drive motor 44 and a rotation shaft of the holder 45, a polishing pan 47 provided in the holder 45, an X-axis slider 48 at which the drive motor 44 and the holder 45 are disposed, an X-axis servo motor 49 mounted on a not illustrated base, a ball screw shaft 49a connected to the X-axis servo motor 49, and a moveable member 49b connected to the X-axis slider 48 and with a screw portion screwed into the ball screw shaft 49a formed therein.

The wafer table 42 holds the wafer W by for example a vacuum suction means.

The polishing pan 47 is provided for collecting the used electrolytic solution and slurry or other liquid.

The drive motor 44 is connected to the table driver 53 and is driven by supply of the drive current from the table driver 53. By controlling this drive current, the semiconductor substrate table 42 can be rotated at a predetermined rotation speed.

The X-axis servomotor 49 is driven to rotate by the drive current supplied from an X-axis driver 54 connected to the X-axis servomotor 49. The X-axis slider 48 moves in the X-axial direction via the ball screw shaft 49a and the moveable member 49b. At this time, by controlling the drive current supplied to the X-axis servo motor 49, the control of the speed of the wafer table 42 in the X-axial direction becomes possible.

The slurry feeder 71 feeds the slurry to the wafer W through a not illustrated feed nozzle. As the slurry, for polishing a copper film, for example use is made of one comprised of an aqueous solution having oxidizing power based on hydrogen peroxide, iron nitrate, potassium iodate, etc. to which aluminum oxide (alumina), cerium oxide, silica, germanium oxide, or the like is added as the polishing abrasive. Note that the slurry may be supplied only when necessary.

The electrolytic solution feeder 81 feeds an electrolytic solution EL including a chelating agent to the wafer W through a not illustrated feed nozzle.

The electrolyte can be one based on an organic solvent or an aqueous solution.

The acid used for the electrolyte may include for example copper sulfate, ammonium sulfate, phosphoric acid, and so on. Examples of alkali include ethyldiamine, NaOH, KOH, and so on.

Further, as the electrolyte, use can also be made of a dilute mixture of organic solvents including ethanol, methanol, glycerin, ethylene glycol, and so on.

The additives include Cu ion series substance, a brightener, or a chelating agent.

For the brightener, use can be made of sulphuric series, copper ion series such as copper hydroxide and copper phosphate, chlorine ion series such as hydrochloric acid and so on, benzotriazole (BTA), or polyethylene glycol.

As the chelating agent, for example, quinoline, anthranilic acid, etc., can be used in addition to the aforethe quinaldine acid, glycin, citric acid, oxalic acid, propionic acid, and so on.

Figure 7:
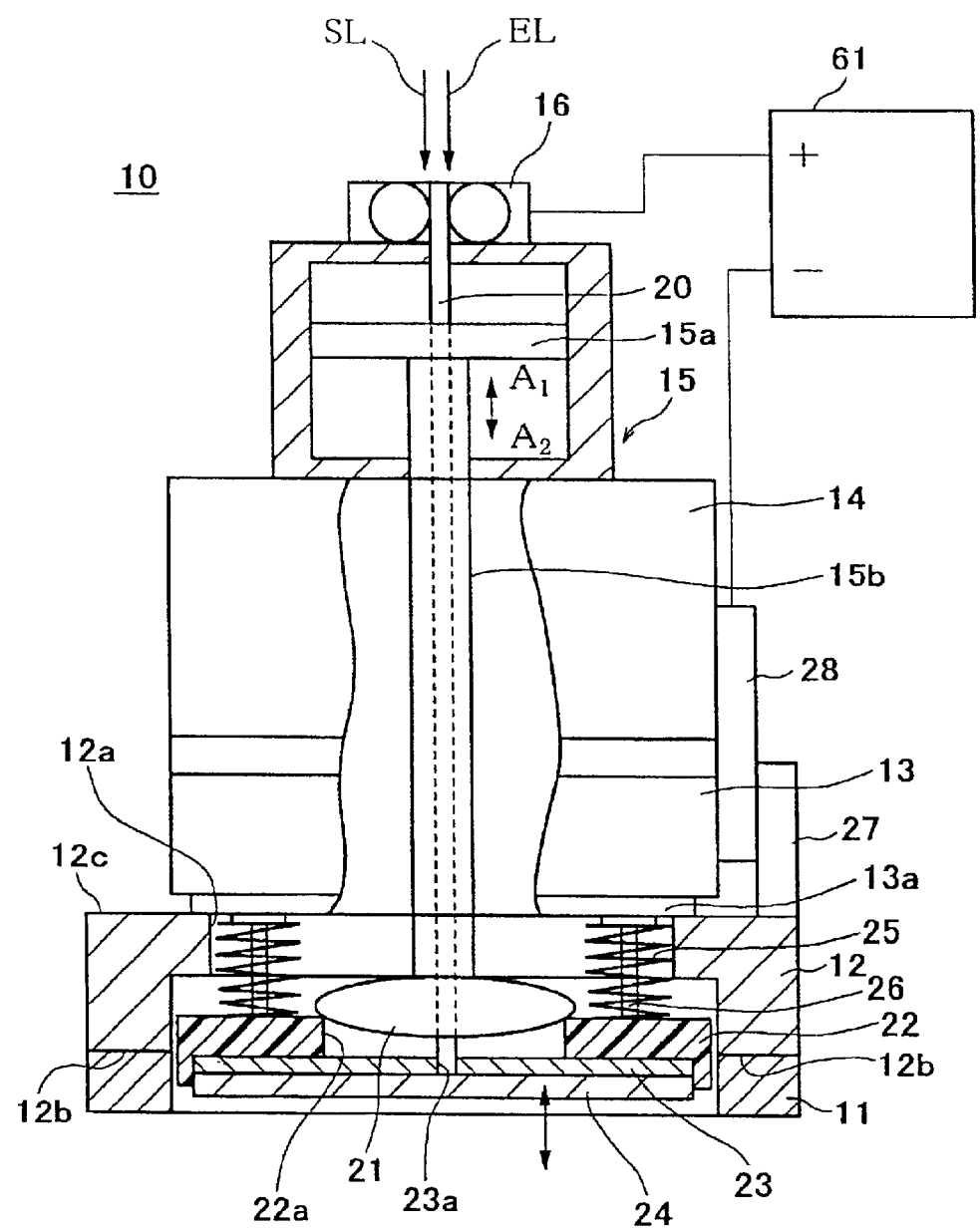
FIG. 7 is an enlarged view of the internal configuration of a polishing tool holding means of a polishing apparatus according to the first embodiment of the present invention.

FIG. 7 is a view of the internal structure of the polishing tool holder 10 of the polishing tool according to the present embodiment.

The polishing tool holder 10 is provided with the polishing tool 11, a flange member 12 for holding the polishing tool 11, the holder 13 for holding the flange member 12 so that it can freely rotate with respect to a main shaft 13a, a main shaft motor 14 for rotating the main shaft 13a held at the holder 13, and a cylinder device 15 provided on the main shaft motor 14.

The main shaft motor 14 is made of for example a direct drive motor. A not illustrated rotor of this direct drive motor is connected to the main shaft 13a.

Further, the main shaft motor 14 has a through hole at its center into which a piston rod 15b of the cylinder device 15 is inserted. The main shaft motor 14 is driven by the drive current supplied from a main shaft driver 52.

The holder 13 is provided with for example an air bearing. The main shaft 13a is rotatably held by this air bearing. Also, the main shaft 13a of the holder 13 has a through hole at its center into which the piston rod 15b is inserted.

The cylinder device 15 is fixed on the case of the main shaft motor 14 and houses a piston 15a. The piston 15a is driven in either direction of the arrows A1 and A2 by for example air pressure fed into the cylinder device 15.

The piston rod 15b is connected to this piston 15a. The piston rod 15b passes through the center of the main shaft motor 14 and the holder 13 and projects from the opening 12a of the flange member 12.

The front end of the piston rod 15b has a pressing member 21 connected to this. This pressing member 21 is connected to the piston rod 15b by a connecting mechanism that can change in posture within a predetermined range.

The pressing member 21 can abut against a circumferential edge of an opening 22a of an insulation plate 22 arranged at a facing position and presses against the insulation plate 22 by the drive of the piston rod 15b to the direction indicated by the arrow A2.

At the center portion of the piston rod 15b of the cylinder device 15 is formed a through hole. A conductive shaft 20 is inserted into the through hole and fixed with respect to the piston rod 15b.

The conductive shaft 20 is formed by a conductive material. An upper end side passes through the piston 15a of the cylinder device 15 and extends to a rotary joint 16 provided on the cylinder device 15, while a lower end side passes through the piston rod 15b and the pressing member 21 and extends to the electrode plate 23 and is connected to the electrode plate 23.

The conductive shaft 20 is formed at its center with a through hole. This through hole forms a feed nozzle for feeding a chemical polishing agent (slurry) and the electrolytic solution containing a chelating agent onto the wafer W.

Further, the conductive shaft 20 performs the role of electrically connecting the rotary joint 16 and the electrode plate 23.

The rotary joint 16 is electrically connected to a plus pole of the electrolytic power supply 61 and maintains the power supply to the conductive shaft 20 even when the conductive shaft 20 rotates.

The electrode plate 23 is held at its upper surface side at the insulation plate 22, an outer circumference of the electrode plate 23 is fitted to the insulation plate 22, and the scrub member 24 is adhered to the lower surface side.

The insulation plate 22 is formed by an insulation material such as a ceramic. This insulation plate 22 is connected to the main shaft 13a by a plurality of rod-like connecting members 26. The connecting members 26 are arranged at equal intervals from the center axis of the insulation plate 22 at predetermined radial positions and held moveably with respect to the main shaft 13a of the holder 13. For this reason, the insulation plate 22 can move in the axial direction of the main shaft 13a.

Further, the insulation plate 22 and the main shaft 13a are connected by a elastic member 25 made of for example a coil spring corresponding to each connecting member 26.

By employing a configuration in which the insulation plate 22 is made moveable with respect to the main shaft 13a of the holder 13 and in which the insulation plate 22 and the main shaft 13a are connected by the elastic member 25, when feeding high pressure air to the cylinder device 15 and moving the piston rod 15b downward in the direction indicated by the arrow A2, the pressing member 21 pushes the insulation plate 22 downward against a recovery force of the elastic member 25, and the scrub member 25 moves downward together with this.

When stopping the feed of the high pressure air to the cylinder device 15, the insulation plate 22 rises due to the recovery force of the elastic member 25 and the scrub member 24 rises together with this.

The polishing tool 11 is tightly fixed to an annular lower end surface 12b of the flange member 12. This polishing tool 11 is formed in the shape of a wheel and provided with an annular polishing surface 11a at its lower end surface. The polishing tool 11 has conductivity and is preferably formed by a relatively soft material. For example, it can be formed by a porous body made of carbon with a binder matrix (binding agent) itself which has conductivity or a resin such as a melamine resin, epoxy resin, or polyvinyl acetal (PVA) containing a conductive material such as sintered copper or a metal compound.

The polishing tool 11 is directly connected to the flange member 12 having conductivity and supplied with power from the conductive brush 27 contacting the flange member 12.

Namely, the conductive member 28 provided at the main shaft motor 14 and the side surface of the holder 13 is electrically connected to the minus pole of the electrolytic power supply 61, while the conductive brush 27 provided in the conductive member 28 is in contact with the upper end surface 12c of the flange member 12. Due to this, the polishing tool 11 is electrically connected to the electrolytic power supply 61 via the conductive member 28, conductive brush 27, and the flange member 12.

The electrolytic power supply 61 (current supplying means) is a device for applying a predetermined voltage between the rotary joint 16 and the conductive member 28 described above. By the application of voltage between the rotary joint 16 and the conductive member 28, a potential difference occurs between the polishing tool 11 and the scrub member 24.

The electrolytic power supply 61 is not a constant voltage power supply for continuously outputting a constant voltage. It is preferable to use a power supply outputting a voltage pulse at a constant period, for example, a DC power supply including a switching regulator circuit.

Concretely, use is made of a power supply for outputting the pulse-like voltage at the constant cycle and capable of suitably changing the pulse width. As an example, use is made of one having an output voltage of DC 150V and a maximum output current of 2 to 3 A and capable of changing the pulse width to either of 1, 2, 5, 10, 20, or 50 $\mu$s.

The pulse-like voltage output having a short width as described above is set in order to make the amount of anodic oxidation per pulse very small. Namely, it is effective for achieving a continuity of small amounts of anodic oxidation for preventing or suppressing as much as possible a sudden huge amount of anodic oxidation of the copper film due, for example, to a discharge due to a sudden change of an inter-electrode distance seen in the unevenness of the copper film formed on the surface of the wafer W or in a case of contact or the like and a spark discharge due to a sudden change of an electrical resistance occurring when air bubbles, particles, or the like are interposed.

Further, the output voltage is relatively high in comparison with the output current, therefore a certain safety margin can be obtained in setting the inter-electrode distance. Namely, even if the inter-electrode distance slightly changes, since the output voltage is high, the change in the current is small.

Note that the applied pulse-like voltage is not limited to the above example. A periodical pulse-like voltage having a rectangular, sinusoidal, sawtooth, or PAM waveform may be applied.

The electrolytic power supply 61 is provided with an ammeter 62 as a current detecting means of the present invention. This ammeter 62 is provided so as to monitor the electrolytic current flowing through the electrolytic power supply 61 and outputs a monitored current value signal 62s to the controller 55.

Further, the electrolytic power supply 61 may also be provided with a resistance meter as a resistance value detecting means replacing the current detecting means. Its function is the same as that of the current detecting means.

The controller 55 has the function of controlling the entire polishing apparatus. Specifically, it outputs a control signal 52s to the main shaft driver 52 to control the rotation speed of the polishing tool 11, outputs a control signal 51s to the Z-axis driver 51 to control the positioning of the polishing tool 11 in the Z-axial direction, outputs a control signal 53s to the table driver 53 to control the rotation speed of the wafer W, and outputs a control signal 54s to the X-axis driver 54 to control the speed of the wafer W in the X-axial direction.

Further, the controller 55 controls the operation of the electrolytic solution feeder 81 and the slurry feeder 71 to control the feeding operation of the electrolytic solution EL and the slurry SL to the polishing head.

Further, the controller 55 is able to control the output voltage of the electrolytic power supply 61, the frequency of the output pulse, the width of the output pulse, etc.

Further, the controller 55 receives as input a current value signal 62s from the ammeter 62 of the electrolytic power supply 61. Based on the current value signal 62s, the controller 55 grasps the state of progress of the polishing of the copper film and controls the operation of the polishing apparatus. Specifically, it controls the Z-axis servo motor 31 to position the polishing tool 11 in a direction perpendicular to the polished surface by using the current value signal 62s as a feedback signal so that the electrolytic current obtained from the current value signal 62s becomes constant or controls the operation of the polishing apparatus so as to stop the polishing based on the current value specified by the current value signal 62s.

A periodical pulse-like voltage can be applied so that the current flowing through the cathode member and the metal film changes in a step-like manner. For example, at the beginning of the process of removing the metal film, a periodical pulse-like voltage is applied so that the current flowing through the cathode member and the metal film rises gradually. Due to this, application of an instantaneous high voltage at the time of starting the application and the decline thereby of the surface condition of the metal film after removal can be prevented.

Further, near the end of the process of removing a metal film, the current value signal 62s becomes small. When the current value signal 62s becomes even smaller than a predetermined threshold, control is performed to reduce the output pulsed voltage near the end. After that, a control signal is output to the electrolytic power to stop the pulse output.

A control panel 56 connected to the controller 55 is used for inputting a variety of data by an operator or displaying the monitored current value signal 62s.

Figure 8A:
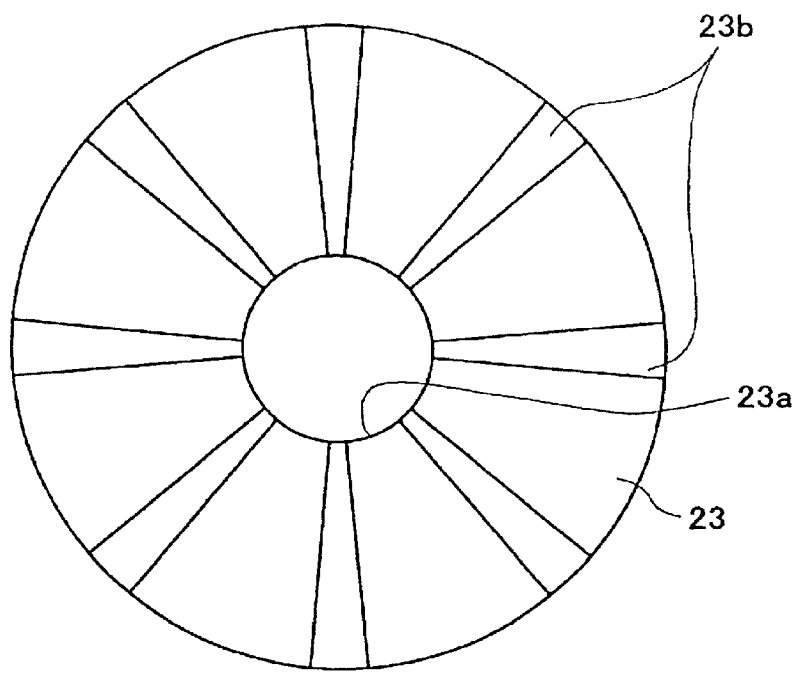
Figure 8B:
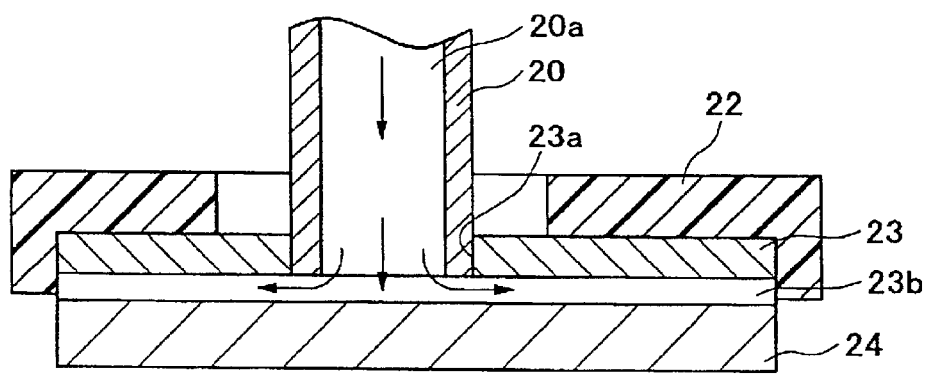
FIG. 8B is an enlarged view of the vicinity of the electrode plate.

Here, FIG. 8A is a bottom view of an example of the structure of the electrode plate 23, and FIG. 8B is a sectional view of the positional relationships among the electrode plate 23, conductive shaft 20, scrub member 24 (cleaning member), and insulation member (plate) 22.

As shown in FIG. 8A, a circular opening 23a (feed nozzle) is formed at the center portion of the electrode plate 23. A plurality of grooves 23b are formed radially extending in a radial direction of the electrode plate 23 around this opening 23a.

Further, as shown in FIG. 8B, the opening 23a of the electrode plate 23 has the lower end of the conductive shaft 20 fitted and fixed to it.

By employing such a configuration, the slurry and the electrolytic solution fed through a feed nozzle 20a formed at the center of the conductive shaft 20 are diffused through the grooves 23b over the entire surface of the scrub member 24.

Namely, when the slurry and the electrolytic solution are fed to the upper surface of the scrub member 24 through the feed nozzle 20a formed at the center of the conductive shaft 20 during rotation of the electrode plate 23, conductive shaft 20, scrub member 24, and the insulation member (plate) 22, the slurry and the electrolytic solution spread to the entire upper surface of the scrub member 24.

Note that the scrub member 24 and the feed nozzle 20a of the conductive shaft 20 correspond to a concrete example of the electrolytic solution feeding means of the present invention. Further, the electrode plate 23, conductive shaft 20, and the rotary joint 15 correspond to a concrete example of the power supplying means of the present invention.

The scrub member 24 adhered to the bottom surface of the electrode plate 23 is formed by a material capable of absorbing the electrolytic solution and the slurry and passing them from the upper surface to the lower surface. Further, this scrub member 24 has a surface for contacting and scrubbing the wafer W. It is formed by for example a soft brush-like material, sponge-like material, or a porous material so as not to cause a scratch etc. in the surface of the wafer W. For example, there can be mentioned a porous body made of a resin such as a urethane resin, a melamine resin, an epoxy resin, or polyvinyl acetal (PVA).

Figure 9:
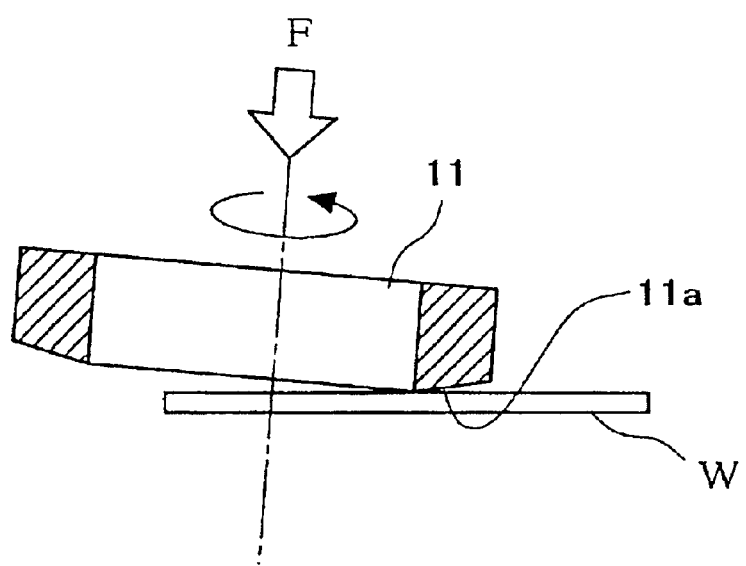
FIG. 9 is a view of the relationship between a polishing tool and a wafer.

FIG. 9 is a view of the positional relation of the polishing tool 11 and the wafer in the course of polishing.

The center axis of the polishing tool 11, for example, is inclined with respect to the wafer W with a minute angle. Further, the main shaft 12a of the holder 13 is inclined with respect to the main surface of the wafer W in the same way as the inclination of the polishing surface 11a. For example, by adjusting an attachment posture of the holder 13 to the Z-axis slider 32, a minute inclination of the main shaft 12a can be created.

In this way, by making the center axis of the polishing tool 11 incline with respect to the main surface of the wafer W with a minute angle, when pushing the polishing surface 11a of the polishing tool 11 against the wafer W with a predetermined polishing pressure F, the effective contact area is maintained constant.

The polishing apparatus according to the present embodiment makes part of the polishing surface 11a of the polishing tool 11 partially act upon the surface of the wafer W, uniformly scans the effective contact area on the surface of the wafer W, and uniformly polishes the entire surface of the wafer W.

Figure 10:
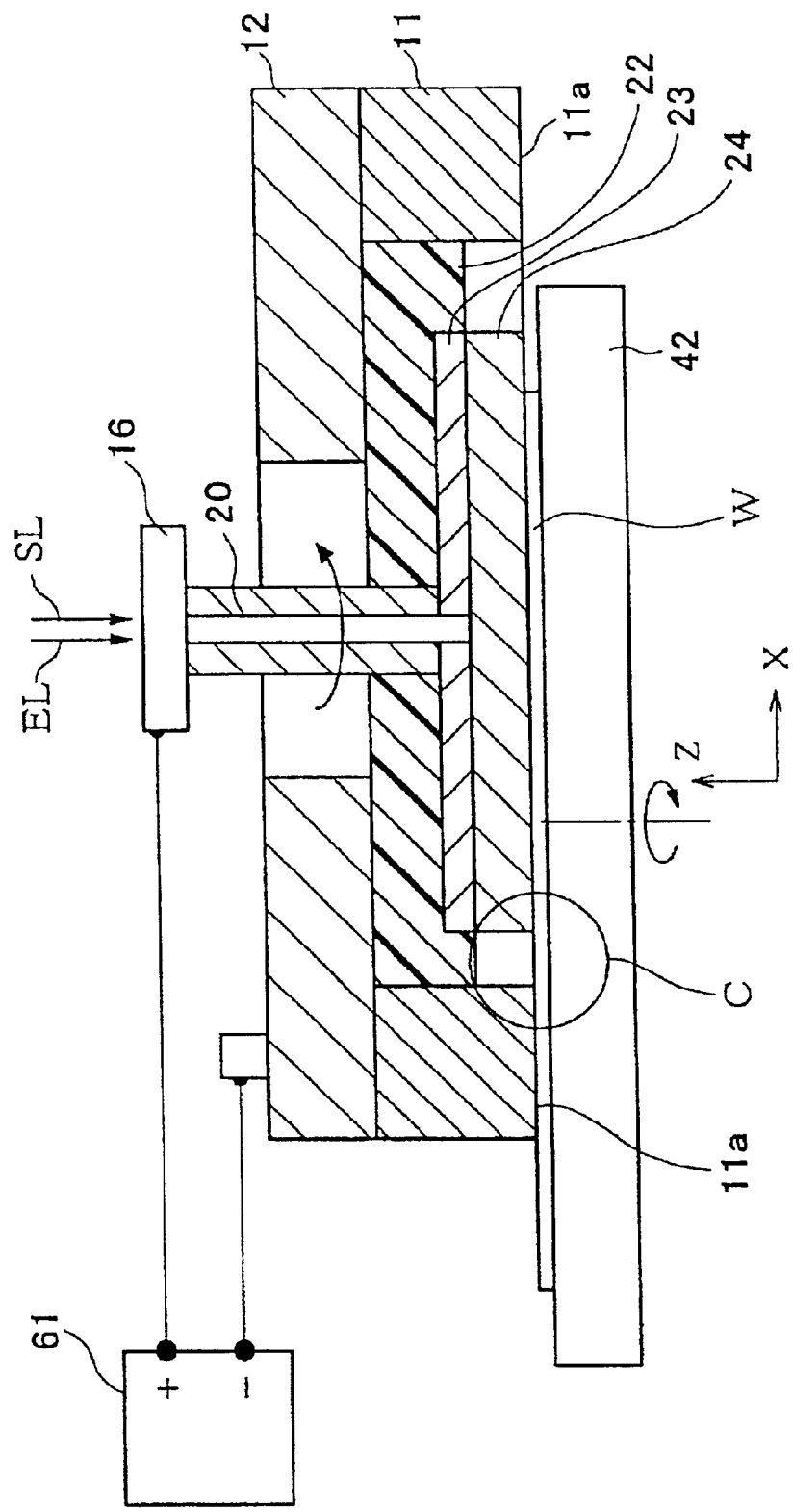
FIG. 10 is a schematic view for explaining the electrolytic polishing of a polishing apparatus according to the first embodiment of the present invention.

Next, an explanation will be made of the polishing operation (polishing method) by the polishing apparatus by taking as an example a case where the copper film formed on the surface of the wafer W is polished. FIG. 10 is a schematic view of a state where the polishing tool 11 is moved downward in the z-axial direction in the polishing apparatus 1 to be brought into contact with the surface of the wafer W.

First, the wafer W is chucked on the wafer table 42, and the wafer table 42 is driven to rotate the wafer W at a predetermined speed.

Further, the wafer table 42 is moved in the X-axial direction, the polishing tool 11 attached to the flange portion 12 is positioned at a predetermined position above the wafer W, and the polishing tool 11 is rotated at the predetermined rotation speed. When the polishing tool 11 is rotated, the insulation plate 22, electrode plate 23, and scrub member 24 connected to the flange portion 12 are driven to rotate. Further, the pressing member 21 pressing against the scrub member 24, piston rod 15b, piston 15a, and the conductive shaft 20 simultaneously rotate.

From this state, when the slurry SL and the electrolytic solution EL are fed to the feed nozzle 20a in the conductive shaft 20 from the slurry feeder 71 and the electrolytic solution feeder 81, the slurry SL and the electrolytic solution EL are fed from the entire surface of the scrub member 24.

The polishing tool 11 is moved downward in the Z-axial direction and the polishing surface 11a of the polishing tool 11 is brought into contact to the surface of the wafer W and pressed by a predetermined polishing pressure.

Further, the electrolytic power supply 61 is activated, a minus potential is applied to the polishing tool 3 through the conductive brush 27, and a plus potential is applied to the scrub member 24 through the rotary joint 16.

Further, high pressure air is fed to the cylinder device 15 to move the piston rod 15b downward in the direction indicated by the arrow A2 of FIG. 7, and the bottom surface of the scrub member 24 is moved up to the position to be brought into contact or proximity with the wafer W.

The wafer table 42 is moved in the X-axial direction with a predetermined speed pattern from this state, whereby the entire surface of the wafer W is uniformly polished.

Figure 11:
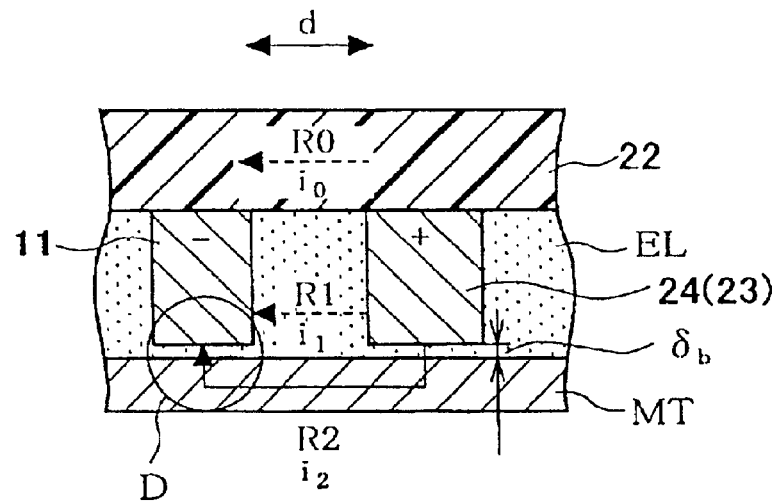
FIG. 11 is an enlarged sectional view of the circular portion C of FIG. 10.
Figure 12:
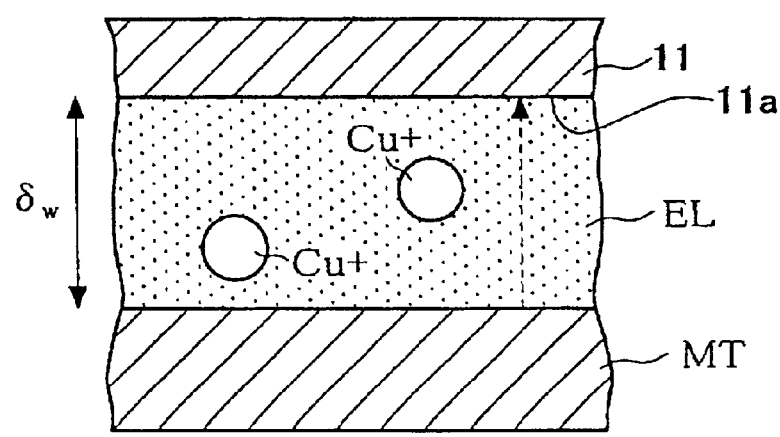
FIG. 12 is an enlarged sectional view of the circular portion D of FIG. 11.

FIG. 11 is an enlarged view of the area in a circle C of FIG. 10, and FIG. 12 is an enlarged view of the area in a circle D of FIG. 11.

As shown in FIG. 11, the scrub member 24, used as the anode, carries current to the copper film MT formed on the wafer W via the electrolytic solution EL or by direct contact. Further, the polishing tool 11, used as the cathode, carries current to the copper film MT formed on the wafer W via the electrolytic solution EL or by direct contact. Note that, as shown in FIG. 11, there is a gap $\delta_b$ between the copper film MT and the scrub member 24. Further, as shown in FIG. 12, there is a gap $\delta_w$ between the copper film MT and the polishing surface 11a of the polishing tool 11.

As shown in FIG. 11, the insulation plate 22 is interposed between the polishing tool 11 and the scrub member 24 (electrode plate 23), but the resistance RO of the insulation plate 22 is very large, accordingly, the current $i_0$ flowing from the scrub member 24 via the insulation plate 22 to the polishing tool 11 is substantially zero, namely no current flows to the polishing tool 11 from the scrub member 24 via the insulation plate 22.

For this reason, the current flowing from the scrub member 24 to the polishing tool 11 is branched into a current $i_1$ which directly flows through a resistance R1 in the electrolytic solution EL to the polishing tool 11 and a current $i_2$ which flows from an interior of the electrolytic solution EL through the copper film formed on the surface of the wafer W to the electrolytic solution EL again and to the polishing tool 11.

When the current $i_2$ flows in the surface of the copper film MT, the copper comprising the copper film MT is oxidized by anodic oxidation by the electrolytic action of the electrolytic solution EL and is chelated by a chelating agent in the electrolytic solution EL.

Here, the resistance R1 in the electrolytic solution EL becomes extremely large in proportion to a distance d between the scrub member 24 as the anode and the polishing tool 11 as the cathode. For this reason, by making the inter-electrode distance d sufficiently larger than the gap $\delta_b$ and the gap $\delta_w$, the current $i_1$ which directly flows through the resistance R1 in the electrolytic solution EL to the polishing tool 11 becomes very small, the current $i_2$ becomes large, and almost all of the electrolytic current passes through the surface of the copper film MT. For this reason, chelation of the copper comprising the copper film MT due to the anodic oxidation can be efficiently carried out.

Further, the magnitude of the current $i_2$ changes according to the size of the gap $\delta_b$ and the gap $\delta_w$, therefore, as mentioned above, by adjusting the size of the gap $\delta_b$ and the gap $\delta_w$ by controlling the position of the polishing tool 11 in the Z-axial direction by the controller 55, the current $i_2$ can be made constant. The size of the gap $\delta_w$ can be adjusted by controlling the Z-axis servo motor 31 by using the current value signal 62s as a feedback signal so that the electrolytic current obtained from the current value signal 62s, that is, the current $i_2$, becomes constant.

Further, the positioning precision of the polishing apparatus in the Z-axial direction is a sufficiently high resolution of 0.1 μm. In addition, the main shaft 13a is inclined with respect to the main surface of the wafer W at a fine angle, so the effective contact area is always maintained constant, therefore if the value of the electrolytic current is controlled constant, the current density can be made always constant and also the amount of chelation of the copper film due to the anodic oxidation can be made always constant.

As described above, the polishing apparatus having the above configuration is provided with an electrolytic polishing function for forming a chelating film by anodic oxidation and removing the same on the surface of the copper film MT formed on the wafer W by the electrolytic action by the electrolytic solution EL.

Further, the polishing apparatus having the above configuration is provided with a chemical mechanical polishing function of the usual CMP apparatus by the polishing tool 11 and the slurry SL in addition to this electrolytic polishing function, so the wafer W can also be polished by the combined action of the electrolytic polishing function and chemical mechanical polishing (hereinafter referred to as electrolytic composite polishing).

Further, the polishing apparatus having the above configuration is also able to perform the polishing by the combined action of the mechanical polishing of the polishing surface 11a of the polishing tool 11 and the electrolytic polishing function without the use of the slurry SL.

According to the polishing apparatus according to the present embodiment, because the copper film can be polished by the combined action of the electrolytic polishing and the chemical mechanical polishing, the copper film can be removed with a much higher efficiency in comparison with a polishing apparatus using only chemical mechanical polishing or mechanical polishing. For the copper film, a high polishing rate can be obtained, therefore it becomes possible to keep a low polishing pressure F of the polishing tool 11 on the wafer W in comparison with a polishing apparatus using only chemical mechanical polishing or mechanical polishing and the occurrence of dishing and erosion can be suppressed.

Further, in using a slurry in the chemical mechanical polishing of the related art, if a slurry containing alumina particles or the like is used, after the polishing, the alumina particles may remain on the copper surface without wear or may even be buried in the surface. By the polishing apparatus according to the present embodiment, however, since the chelate film existing on the surface has a very low mechanical strength, it can be removed effectively even by only mechanical polishing using an electrolytic solution including a chelating agent not containing a polishing abrasive, so particles and slurry can be prevented from remaining on the wafer surface.

Further, the positioning precision of the polishing apparatus in the Z-axial direction is a sufficiently high resolution of 0.1 μm, in addition, the main shaft 13a is inclined with respect to the main surface of the wafer W at a fine angle, so the effective contact area is always maintained constant, therefore if the value of the electrolytic current is controlled constant, the current density can be made always constant and also the amount of chelation of the copper film due to the anodic oxidation can be made always constant.

In the above embodiment, the absolute value of the amount of polishing of the copper film can be controlled by the cumulative amount of the electrolytic current and the time by which the polishing tool 11 passes over the wafer W.

Modification 1

Figure 13:
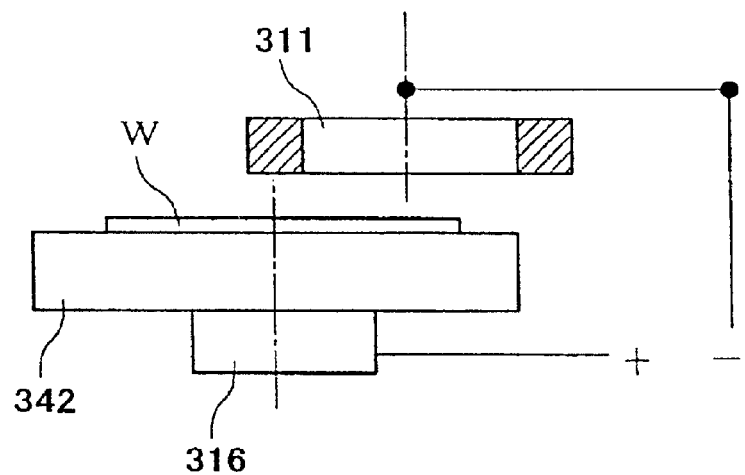
FIG. 13 is a view of a first modification of the polishing apparatus according to the present invention.

FIG. 13 is a schematic view of a first modification of a polishing apparatus according to the present invention.

In the polishing apparatus according to the embodiment mentioned above, the current was conducted to the surface of the wafer W by the conductive plate 23 provided with the conductive polishing tool and the scrub member 24.

As shown in FIG. 13, it is also possible to give the wheel-like polishing tool 311 conductivity in the same way as the case of the aforethe polishing apparatus and to give conductivity to a wafer table 342 for chucking and rotating the wafer W. Power is supplied to the polishing tool 311 by a configuration similar to that of the embodiments.

In this case, in supplying current to the wafer table 342, electrolytic current can be supplied by providing a rotary joint 316 below the wafer table 342 and constantly maintaining the flow of current to the wafer table 342 rotating by the rotary joint 316.

Modification 2

Figure 14:
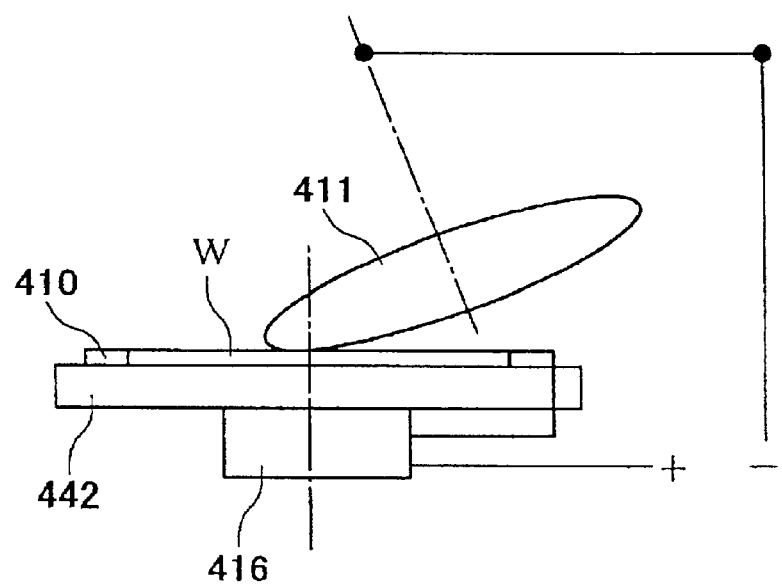
FIG. 14 is a view of a second modification of the polishing apparatus according to the present invention.

FIG. 14 is a schematic view of a second modification of a polishing apparatus according to the present invention.

A wafer table 442 for chucking and rotating the wafer W holds the wafer W by a retainer ring 410 provided on the periphery of the wafer W.

Conductivity is imparted to a polishing tool 411, conductivity is imparted to the retainer ring 410, and power is supplied to the polishing tool 411 by a configuration similar to that of the embodiments mentioned above.

Further, the retainer ring 410 covers up to the barrier layer portion formed on the wafer W and supplies current. Further, the retainer ring 410 is supplied with power through a rotary joint 416 provided below the wafer table 442.

Note that by making the amount of inclination of the polishing tool 411 larger so that a gap more than the thickness of the retainer ring 410 can be maintained at the edge portion even if the polishing tool 411 contacts the wafer W, interference between the polishing tool 411 and the retainer ring 410 can be prevented.

Modification 3

Figure 15:
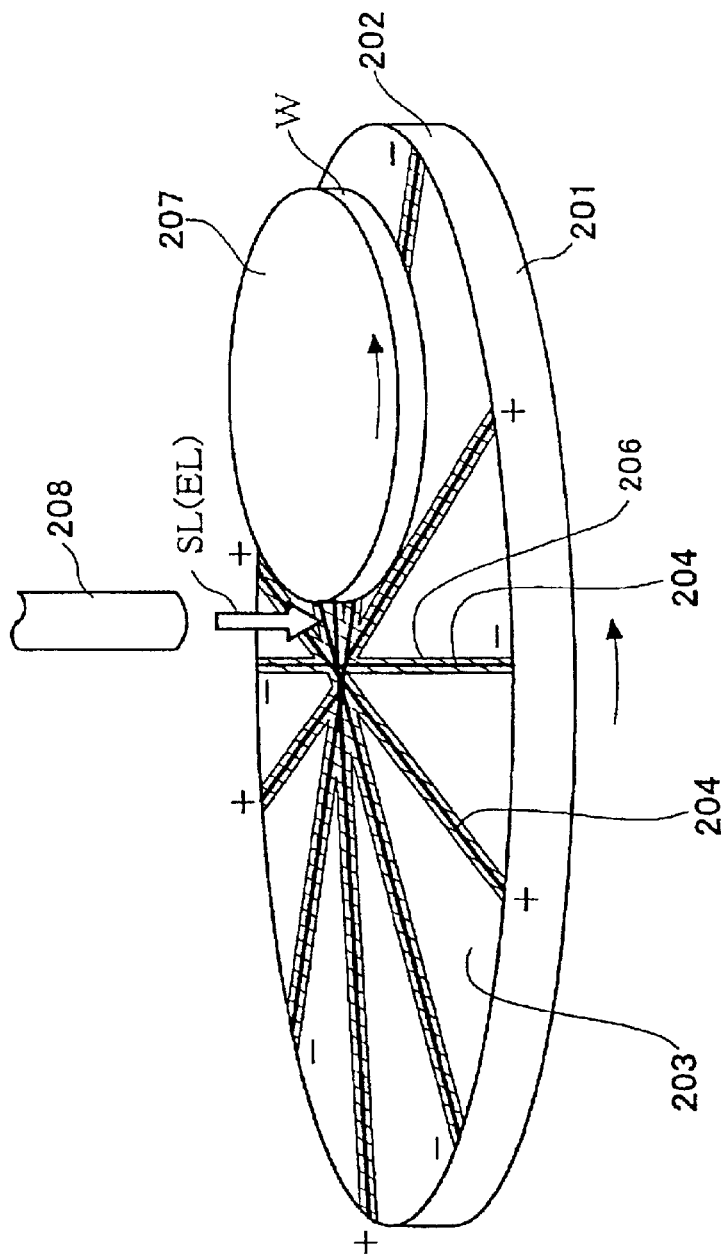
FIG. 15 is a view of a third modification of a conventional CMP apparatus of a polishing apparatus according to the present invention.

FIG. 15 is a schematic view of a third modification of a polishing apparatus according to the present invention.

The polishing apparatus shown in FIG. 15 is obtained by adding the electrolytic polishing function of the present invention to the CMP apparatus of the related art. It flattens the surface of the wafer W by bringing the entire surface of the wafer W chucked by a wafer chuck 207 into contact with the polishing surface of the polishing tool comprised of a plate 201 to which a polishing pad (polishing fabric) 202 is adhered while rotating the wafer W.

Anode electrodes 204 and cathode electrodes 203 are alternately radially arranged on the polishing pad 202. Further, the anode electrodes 204 and the cathode electrodes 203 are electrically insulated by an insulator 206, and the anode electrodes 204 and the cathode electrodes 203 are supplied with the current from the plate 201 side. The polishing pad 202 is constituted by these anode electrodes 204, cathode electrodes 203, and insulator 206.

The wafer chuck 207 is formed by the insulation material.

This polishing apparatus is provided with a feeder 208 for feeding the electrolytic solution EL and the slurry SL to the surface of the polishing pad 202, whereby electrolytic composite polishing combining electrolytic polishing and chemical mechanical polishing becomes possible.

Figure 16:
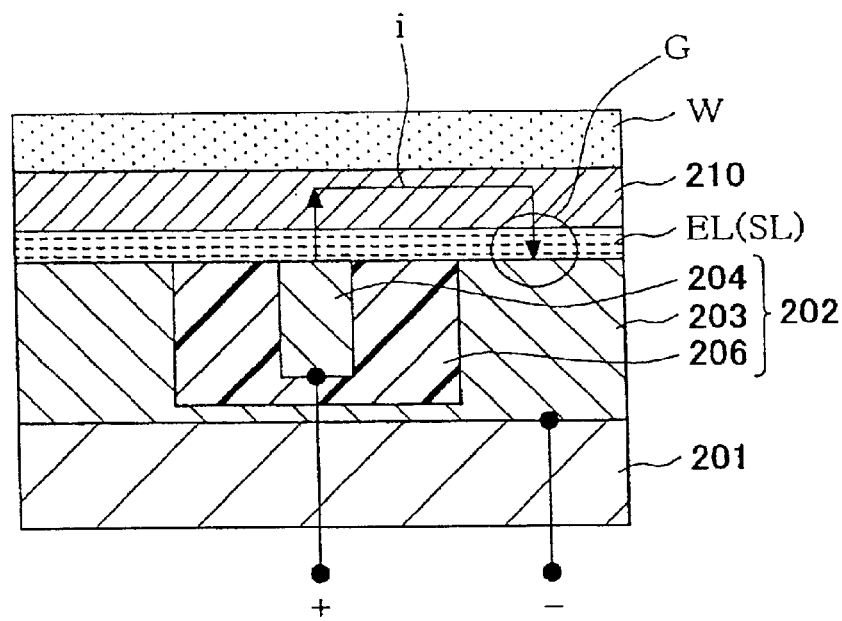
FIG. 16 is a view for explaining an electrolytic composite polishing operation by the polishing apparatus shown in FIG. 15.

Here, FIG. 16 is a view for explaining the electrolytic composite polishing operation (polishing method) by the polishing apparatus having the above configuration. Note that, it is assumed that for example a copper film 210 is formed on the surface of the wafer W.

As shown in FIG. 16, DC voltage is applied between the anode electrodes 204 and the cathode electrodes 203 in the state where the electrolytic solution EL and the slurry SL are interposed between the copper film 210 formed on the surface of the wafer W and the polishing surface of the polishing pad 202, during the electrolytic composite polishing. The current i passes through the electrolytic solution EL from the anode electrode 204, is transmitted in the copper film 210, and passes through the electrolytic solution EL again to flow to the cathode electrode 203.

At this time, near the interior of the circle G shown in FIG. 16, a chelating film is formed on the surface of the copper film 210 due to anodic oxidation. This chelating film is removed by the mechanical removal action due to the polishing pad 202 and the slurry SL, and therefore the copper film is flattened.

By employing such a configuration, effects similar to those by the polishing apparatus according to the embodiments described above are exhibited.

Figure 17:
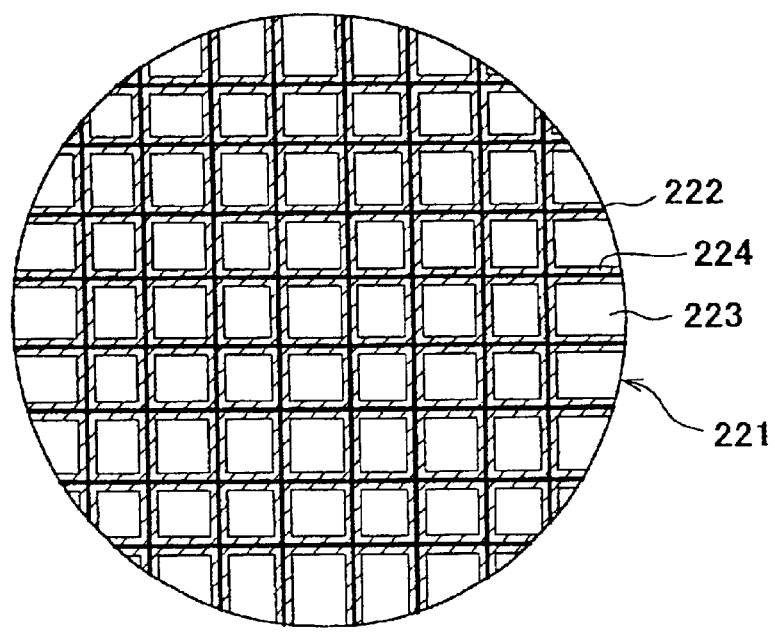
FIG. 17 is a view of another example of an electrode configuration of a polishing pad.

Note that the arrangement of the anode electrodes and the cathode electrodes provided on the polishing pad is not limited to the configuration of FIG. 15. For example, as shown in FIG. 17, it is also possible to employ a polishing pad 221 in which a plurality of linear anode electrodes 222 are vertically and laterally aligned at equal intervals, a cathode electrode 223 is arranged in each rectangular region surrounded by the anode electrodes 222, and the anode electrodes 222 and the cathode electrodes 223 are electrically insulated by an insulator 224.

The polishing apparatus according to the present invention is not limited to the above embodiments. Numerous modifications could be made thereto without departing from the basic concept and scope of the invention in, for example, the materials comprising the apparatus, methods for supplying a current to a wafer, and so on.

Figure 18:
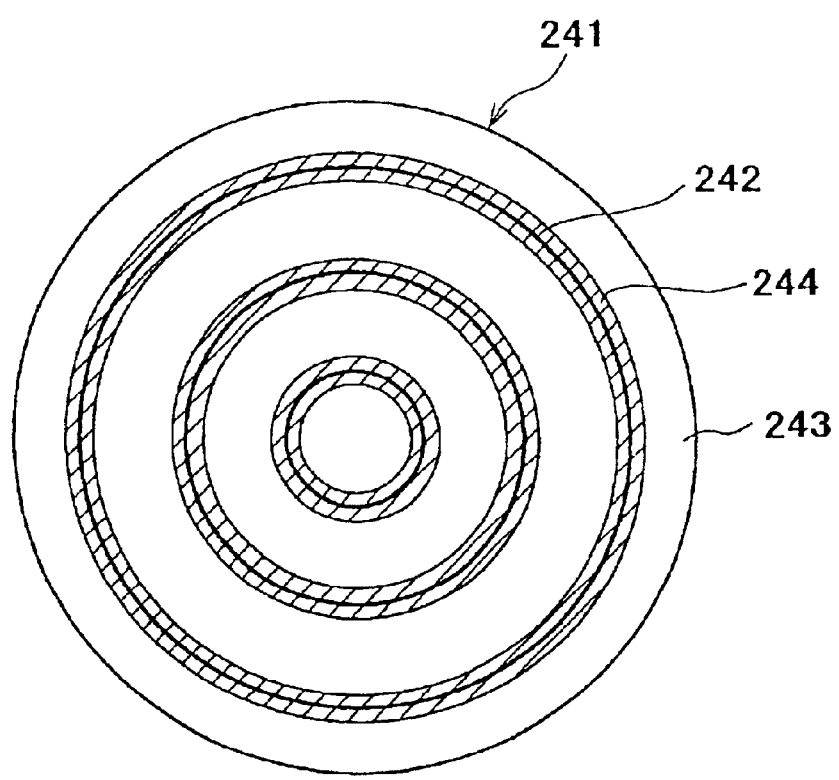
FIG. 18 is a view of still another example of an electrode configuration of a polishing pad.

Further, for example, as shown in FIG. 18, it is also possible to employ a polishing pad 241 in which annular anode electrodes 242 having radii different from each other are arranged in concentric circles, cathode electrodes 243 are arranged in the annular regions formed between the anode electrodes 242, and the anode electrodes 242 and the cathode electrodes 243 are electrically insulated by an insulator 244.

Second Embodiment

Figure 19:
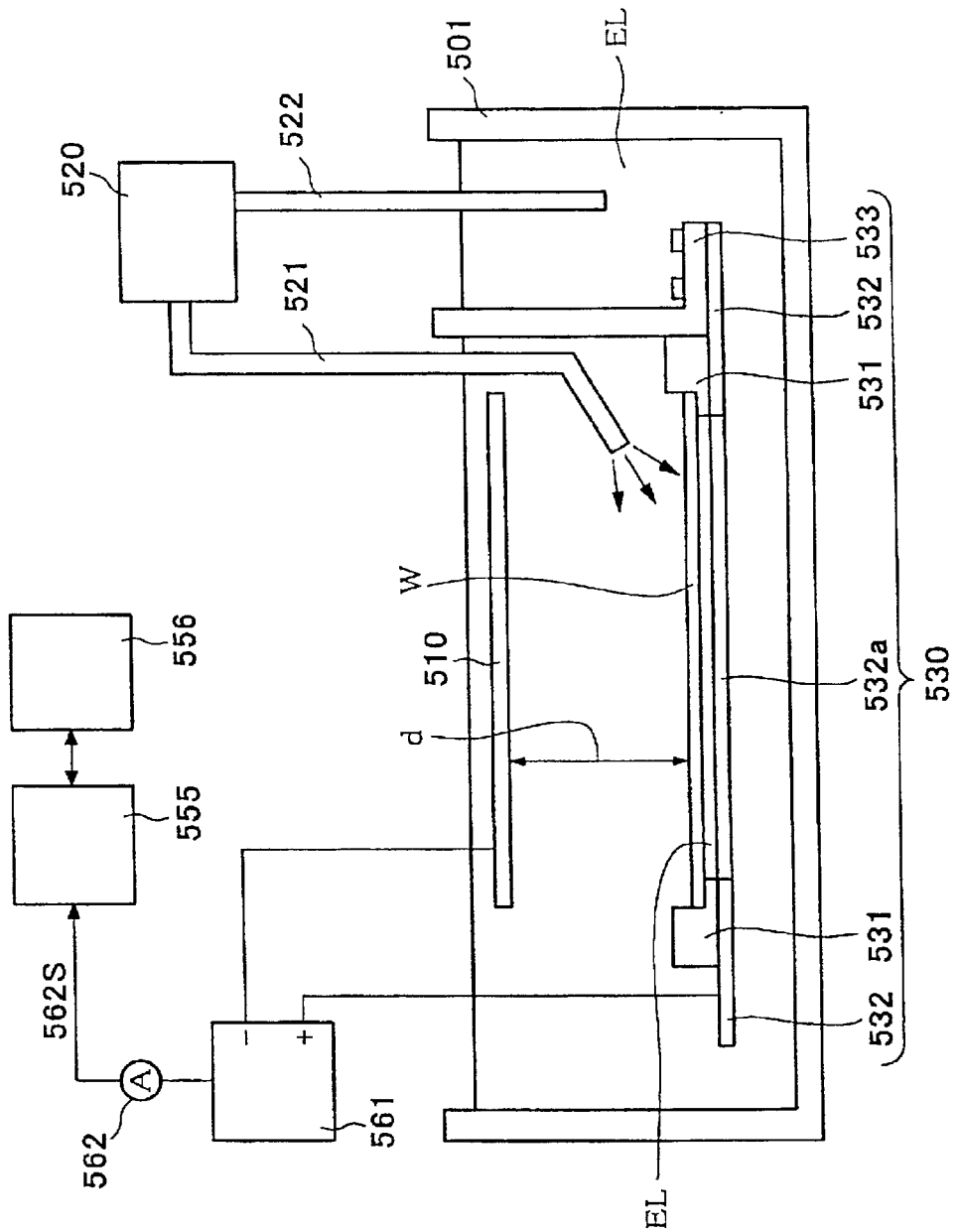
FIG. 19 is a schematic view of the configuration of a polishing apparatus according to a second embodiment of the present invention.

FIG. 19 is a schematic view of the configuration of a polishing apparatus according to a second embodiment of the present invention. The polishing apparatus according to the present embodiment comprises a tank 501 filled with a predetermined amount of electrolytic solution EL, a wafer holding means 530 and an electrode plate 510 arranged in the electrolytic solution EL in the tank, a jet pump 520 (flowing means) for sucking the electrolytic solution EL in the tank using a tube 522 and ejecting the same as a jet using a tube 521, a power supply 561 (electrolytic current supplying means) for applying a voltage using the electrode plate 510 as a cathode and a wafer as an anode, an ammeter 562, a controller 555, and a control panel 556.

The holding means 530 comprises a first holding member 531 and a second holding member 532 having conductivity and for holding a wafer and a Z-axis positioning mechanism fixed to a not illustrated column and for fixing the first holding member and the second member to specific positions. The second holding member positioned below the wafer has a circular aperture at the portion 532a.

The electrode plate 510 is arranged parallel with the wafer in the electrolytic solution EL and is made of for example oxygen-free copper or the like.

The electrolytic solution EL for example contains a chelating agent for chelating copper. Other additives may also be included. As the chelating agent, use is made of quinaldine acid, glycin, citric acid, oxalic acid, or propionic acid. The additives may include copper sulfate for reducing the voltage applied between the wafer and the electrode plate 510.

The electrolytic power supply 561 (electrolytic current supplying means) is not a constant voltage power supply for continuously outputting a constant voltage. It is preferable to use a power supply outputting a voltage pulse at a constant period. For example, the voltages applied by the electrolytic power supply 561 are DC pulsed voltages with a high voltage and low voltage repeated every five seconds (for example, voltage 30 to 40V, current 2.2 A, and depending on the voltage tolerance of a semiconductor element, may also be set for example 10 to 20V).

The above DC pulsed power supply is preferably capable of selecting a voltage and pulse width able to most effectively remove a copper film by adjusting a distance d between the wafer and the electrode plate 510 or others.

If the distance between the electrode plate 510 and the wafer is to small, the flushing action of the electrolytic solution between the electrode plate 510 and the wafer does not function sufficiently. Preferably, the distance d is set larger than a specific value according to the setting of the above voltage.

The electrolytic power supply 561 is provided with an ammeter 562 as a current detecting means of the present invention. This ammeter 562 is provided to monitor the electrolytic current flowing to the electrolytic power supply 561 and outputs the monitored current value signal 562s to the controller 555.

Further, the controller 555 receives as input a current value signal 562s from the ammeter 562 of the electrolytic power supply 561. The controller 555 is able to control the operation of the polishing apparatus based on the current value signal 562s. Specifically, it controls the operation of the polishing apparatus so as to stop the polishing based on the current value specified by the current value signal 562s.

A control panel 556 connected to the controller 555 is used for inputting a variety of data by an operator or displaying the monitored current value signal 562s.

According to the polishing apparatus configuration described above, as the polishing apparatus according to the first embodiment, for example, in a case where an uneven copper film is formed on the surface of a wafer, by applying a voltage using the wafer as an anode, the surface of the copper film on the wafer is oxidized by the anodic oxidation. The oxidized copper film is chelated by the chelating agent in the electrolytic solution EL. Because the mechanical strength of the chelate film is very low, the projecting portions of the chelate film are removed by the flushing action of the electrolytic solution from the tube 521 of the jet pump 520, whereby the copper film is flattened.

Further, by monitoring the electrolytic current, the polishing process can be controlled, so it becomes possible to correctly grasp the state of progress of the polishing process.

According to the polishing apparatus according to the present embodiment, since the copper film can be flattened by removing the chelate film of a very low mechanical strength, the copper film can be removed with a much higher efficiency in comparison with a polishing apparatus using only chemical mechanical polishing or mechanical polishing.

Since a strong pushing force as in a polishing apparatus is not necessary, the damage to the interlayer insulation film below the copper film can be suppressed very small and occurrence of dishing, erosion, etc. can be suppressed. Because there is no high pressure applied to the insulation film below the copper film, as the insulation film, use may be made of a low dielectric constant material having a mechanical strength lower than silicon dioxide using TEOS as a stock material.

Further, as a polishing apparatus, because the hardware configuration is simple, reduction of its size can be easily realized, maintenance is easy, and the operation rate can be improved.

Further, in the chemical mechanical polishing of the related art, when using a slurry containing alumina particles etc., the alumina particles may remain on the copper film surface without wear after polishing, or they may be buried in the surface of the copper. In the polishing method of the present invention, however, these problems do not happen.

The present invention is not limited to the above embodiments. Numerous modifications could be made thereto without departing from the basic concept and scope of the invention in for example the configuration of the jet pump, type of the electrode plate, configuration of the apparatus holding a wafer in the tank, and so on.

Third Embodiment

Figure 20:
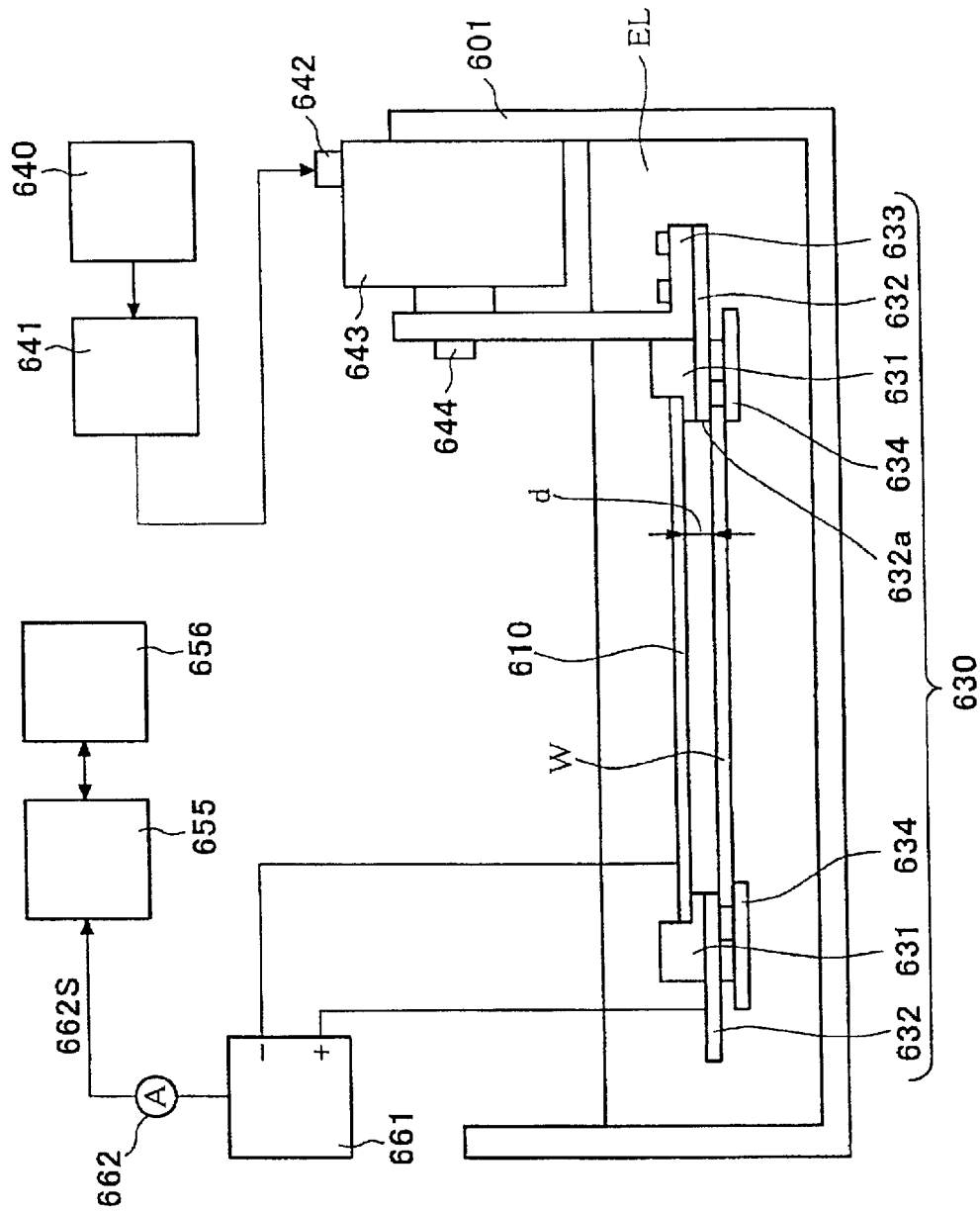
FIG. 20 is a schematic view of the configuration of a polishing apparatus according to a third embodiment of the present invention.

FIG. 20 is a schematic view of the configuration of a polishing apparatus according to a third embodiment of the present invention. The polishing apparatus according to the present embodiment comprises a vibration applying means including a pulse generator 640, an amplifier 641, and an oscillator 643, a tank 601 filled with a predetermined amount of electrolytic solution EL, a wafer holding means 630 and an electrode plate 610 arranged in the electrolytic solution EL in the tank, a power supply 661 (electrolytic current supplying means) for applying a voltage using the electrode plate 610 as a cathode and a wafer as an anode, an ammeter 662, a controller 655, and a control panel 656.

The holding means 630 comprises a first holding member 631 for holding the electrode plate to be parallel with the wafer W, a second holding member 632 and a third holding member 633 for pressing and fixing the wafer between them, and a fourth holding member 634 with one end attached to the second holding member 632 and the other end to the oscillator 643.

The second holding member 632 is made of a conductive material and functions to conduct a current through the wafer serving as an anode. Further, the second holding member 632 has an aperture portion 632a for exposing the surface of the wafer to the electrode plate 610.

The electrolytic solution EL for example contains a chelating agent for chelating copper. Other additives may also be included. As the chelating agent, use is made of quinaldine acid, glycin, citric acid, oxalic acid, or propionic acid. The additives may include copper sulfate for reducing the voltage applied between the wafer and the electrode plate 610.

The electrode plate 610 is arranged parallel with the wafer in the electrolytic solution EL and is made of for example oxygen-free copper or the like.

The electrolytic power supply 661 (electrolytic current supplying means) is not a constant voltage power supply for continuously outputting a constant voltage. It is preferable to use a power supply outputting a voltage pulse at a constant period. For example, the voltages applied by the electrolytic power supply 661 are DC pulsed voltages with a high voltage and low voltage repeated every five seconds (for example, voltage 30 to 40V, current 2.2 A, and depending on the voltage tolerance of a semiconductor element, may also be set for example 10 to 20V).

The above DC pulsed power supply is preferably capable of selecting a voltage and pulse width able to most effectively remove a copper film by adjusting a distance d between the wafer and the electrode plate 610 etc.

If the distance between the electrode plate 610 and the wafer is too small, the flowing action of the electrolytic solution between the electrode plate 610 and the wafer does not function sufficiently. Preferably, the distance d is set larger than a specific value according to the setting of the above voltage.

The electrolytic power supply 661 is provided with an ammeter 662 as a current detecting means of the present invention. This ammeter 662 is provided to monitor the electrolytic current flowing to the electrolytic power supply 661 and outputs the monitored current value signal 662s to the controller 655.

Further, the controller 655 receives as input a current value signal 662s from the ammeter 662 of the electrolytic power supply 661. The controller 655 is able to control the operation of the polishing apparatus based on the current value signal 662s. Specifically, it controls the operation of the polishing apparatus so as to stop the polishing based on the current value specified by the current value signal 662s.

A control panel 656 connected to the controller 655 is used for inputting a variety of data by an operator or displaying the monitored current value signal 662s.

According to the polishing apparatus configuration described above, as the polishing apparatus according to the first embodiment, for example, in a case where an uneven copper film is formed on the surface of a wafer W, by applying a voltage using the wafer as an anode, the surface of the copper film on the wafer is oxidized by the anodic oxidation. The oxidized copper film is chelated by a chelating agent in the electrolytic solution EL. Because the mechanical strength of the chelate film is very low, the projecting portions of the chelate film are removed by vibration of the wafer applied by the oscillator 643, whereby the copper film is flattened.

Further, by monitoring the electrolytic current, the polishing process can be controlled, so it becomes possible to correctly grasp the state of progress of the polishing process.

According to the polishing apparatus according to the present embodiment, since the copper film can be flattened by removing the chelate film of a very low mechanical strength, the copper film can be removed with a much higher efficiency in comparison with a polishing apparatus using only chemical mechanical polishing or mechanical polishing.

Since a strong pressing force as used in a polishing apparatus is not necessary, the damage to the interlayer insulation film below the copper film can be suppressed very small, and occurrence of dishing, erosion, etc. can be suppressed. Because there is no high pressure applied to the insulation film below the copper film, as the insulation film, use may be made of a low dielectric constant material having a mechanical strength lower than silicon dioxide using TEOS as a stock material.

Further, as a polishing apparatus, because the hardware configuration is simple, reduction of its size can be easily realized, maintenance is easy, and the operation rate can be improved.

Further, in the chemical mechanical polishing of the related art, when using a slurry containing alumina particles etc., the alumina particles may remain on the copper film surface without wear after polishing or may be buried in the surface of the copper. In the polishing method of the present invention, however, these problems do not happen.

The present invention is not limited to the above embodiments. Numerous modifications could be made thereto without departing from the basic concept and scope of the invention in for example the configurations of the oscillator and the amplifier, type of the electrode plate, configuration of the apparatus holding a wafer in the tank, and so on.

Fourth Embodiment

Figure 21:
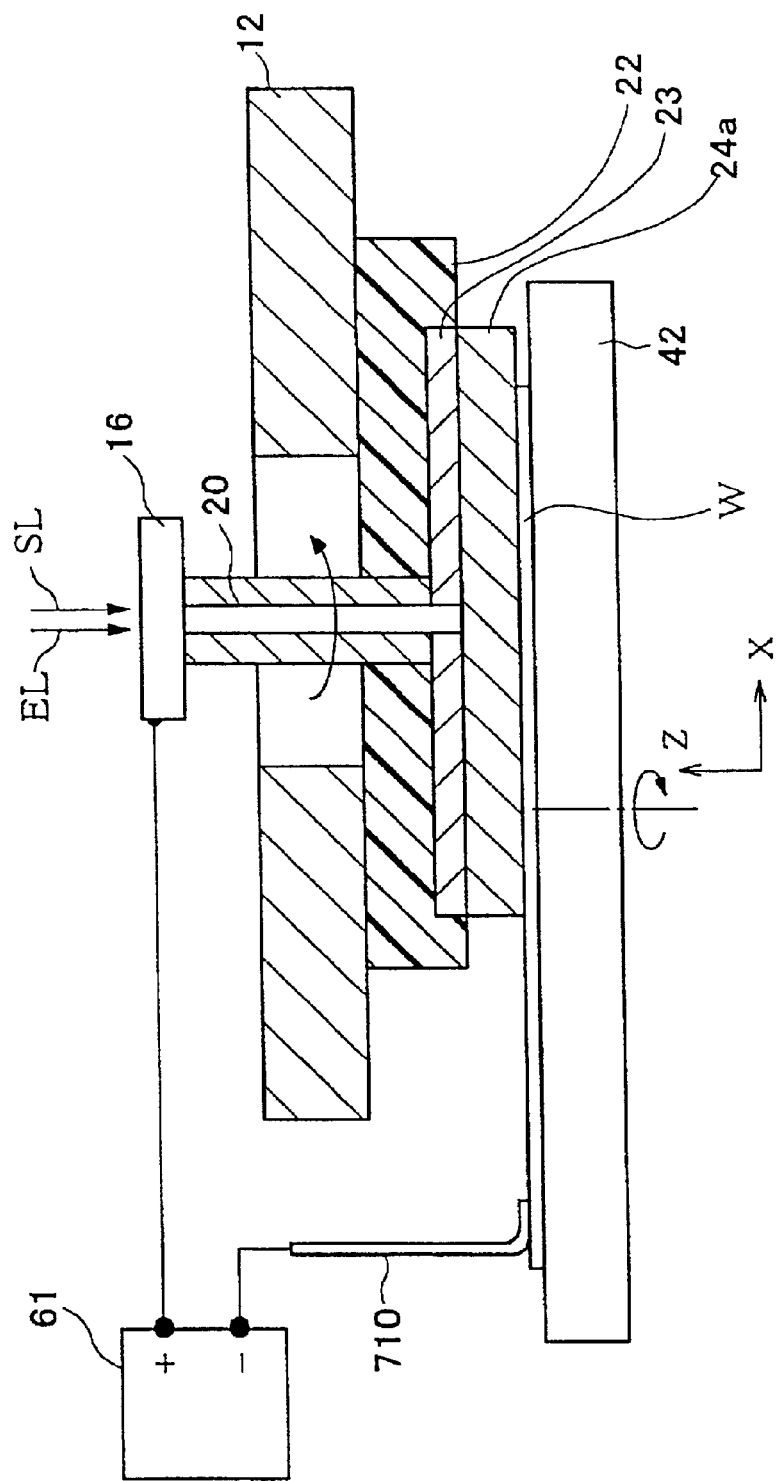
FIG. 21 is a view of a configuration of a polishing apparatus according to a fourth embodiment of the present invention.

FIG. 21 is a view of the configuration of the principal portion of a polishing apparatus according to the present invention.

The basic configuration is the same as the first embodiment, but in the present embodiment, a polishing tool is not used. Instead, a metal film on a wafer is removed by a wiping member 24a.

Accordingly, for simplicity, only parts different from the first embodiment are explained.

The wiping member 24a, for example, is made of polyvinyl acetal (PVA), urethane foam, Teflon foam, Teflon nonwoven fabric, or the like. As their electric characteristics, they need to be insulators that do not conduct electricity or ions. For this, they are formed like fibers. Accordingly, an electrolytic solution can seep through the air holes in the fiber-like wiping member and fill the space between an electrode 22 and a wafer W.

The wiping member 24a requires certain strength for it and the surface of the wafer W to be pressed to remove a metal film on the surface of the wafer.

For example, along with an elastic strength for tolerating 20 to 100 $g/cm^2$ pressure for wiping off only projecting portions of a metal film on the surface of a wafer W, a soft strength not causing scratches is required.

For example, an elastoplastic material can be used for the wiping member 24.

Further, the electrode 23, for example, is preferably provided with an air hole for releasing the gas produced on the polished surface due to an electrolytic action of the metal film on the surface of the wafer W. The air hole is provided also for preventing disadvantages resulting from the non-uniformity of the electrolytic action between the electrode 23 and the wafer W caused by the gas.

Further, the electrode 23 may be provided to be able to be driven to rotate. As a result, the gas produced on the polished surface due to electrolytic action can be released from between the wafer W and the electrode 23 by the rotation of the electrode 23.

Further, the electrode 23 may be divided into several regions, whereby the electrolytic action to the polished surface can be selectively carried out in individual regions.

The electrolytic power supply 61, as the first embodiment, applies a predetermined pulsed voltage between the previously described rotary joint 16 and a conductive brush 710 contacting the wafer.

Here, in the present embodiment, the voltage is applied in a reverse direction, therefore, the conductive brush 710 and electrode 23 become the anode and cathode, respectively. In addition to the configuration of applying voltage by contacting the metal film on the surface of a wafer W using the conductive brush 710 as shown here, a configuration may also be employed which is provided with an electrode capable of being brought into proximity with the metal film on the surface of the wafer W for applying a voltage.

The conductive brush 710 conducts a current to the wafer from the electrolytic power supply 61 contacting the surface of the wafer. Therefore, the current supplied from the electrolytic power supply 61 flows from the conductive brush 710 to the metal film on the surface of the wafer W and to the electrode 22 through the electrolytic solution.

The operation of the above polishing apparatus is explained below.

First, the wafer W is chucked on the wafer table 42, and the wafer table 42 is driven to rotate the wafer W at a predetermined speed.

The wafer table 42 is moved in the X-axial direction, the wiping member 24a is positioned at a predetermined position above the wafer W, and the wiping member 24a is rotated at a predetermined speed. For example, the wiping member 24a rotates at 100 rpm.

From this state, when the slurry SL and the electrolytic solution EL are fed to the feed nozzle 20a in the conductive shaft 20 from the slurry feeder 71 and the electrolytic solution feeder 81, the slurry SL and the electrolyte EL are fed from the entire surface of the wiping member 24a.

Then, the electrolytic power supply 61 is activated, a positive voltage is applied to the metal film on the surface of the wafer through the conductive brush 27, and a negative voltage is applied to the electrode 23 through the rotary joint 16.

As a result, a positive voltage is applied directly to the metal film on the surface of the wafer through the conductive brush 27, and a current is conducted to the electrode 22 through the electrolytic solution.

Therefore, a current can be supplied through the electrolytic solution using the metal film below the wiping member 24a as the anode. The metal film is oxidized by the anodic oxidation caused by an electrolytic action of the electrolytic solution and is chelated by a chelating agent in the electrolytic solution.

In the above state, high pressure air is fed to the cylinder device 15 to move the piston rod 15b downward, and the bottom surface of the wiping member 24a is brought into contact with the surface of the wafer W.

The wafer table 42 is moved in the X-axial direction with a predetermined speed pattern from this state, whereby the entire surface of the wafer W is uniformly wiped.

As shown above, a polishing apparatus employing the above configuration is able to produce a chelating film described above by the anodic oxidation on the surface of a metal film formed on a wafer W and remove it.

According to the polishing apparatus of the present embodiment, effects similar to the one according to the first embodiment are exhibited.

Further, in the polishing apparatus according to the present embodiment, because a polishing tool is not used and the step difference of a metal film on the surface of a wafer can be reduced by only wiping using the wiping member 24a, the pressure against the wafer can be further reduced lower than in the polishing apparatus according to the first embodiment.

In the present embodiment, rotation of the wiping member was shown an example of the wiping method, but the wiping member can also be moved relative to the wafer W. For example, a wiping member can be moved by providing a horizontal moving means. In the case of wiping by horizontal movement, it is preferable to set the speed of the horizontal movement below about 15 m/min in order to prevent the electrolytic solution from spraying out.

Preferably, the temperature of the electrolytic solution is adjusted below 80 degree or so in order to accelerate the anodic oxidation.

Further, the electrolytic solution fed to the surface of the polishing object can be held by surface tension.

As described previously, there is no limit to the polishing object.

Next, further embodiments of the method of production and method of polishing of a semiconductor device of the present invention and a polishing apparatus using the same will be explained with reference to the drawings.

Fifth Embodiment

Figure 22A:
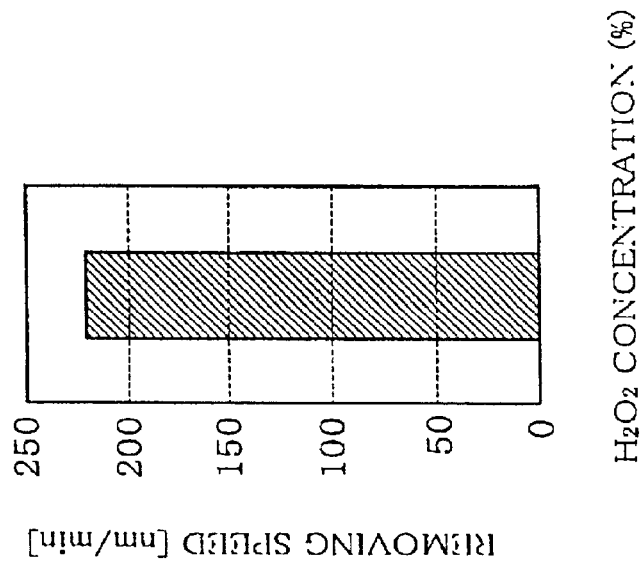

FIG. 22A and FIG. 22B compare the amount of copper film removed per unit time when removing a copper film on the surface of a wafer by chelation by anodic oxidation employing the polishing apparatus according to the third embodiment of the present invention and the amount of copper film removed per unit time when removing a copper film on the surface of a wafer by oxidation with hydrogen peroxide ($H_2O_2$) of a predetermined concentration added to the electrolytic solution EL as an oxidant of the copper film on the surface of a wafer, without applying a voltage on the wafer W, employing the polishing apparatus according to the third embodiment of the present invention.

FIG. 22A shows removal rates when removing copper by adding an oxidant without applying a voltage to oxidize the copper and then chelating it. The amount of copper film removed per unit time (removal rate) was measured using a quinaldine acid solution as the electrolytic solution at concentrations of hydrogen peroxide ($H_2O_2$) of 0%, 4.5%, 8%, 10.7%, respectively. Note that the volume of the electrolytic solution was 150 ml.

Further, FIG. 22B shows the removal rate when copper was removed using the polishing apparatus according to the third embodiment of the present invention. The amount of copper film removed per unit time (removal rate) was measured when using 150 ml quinaldine acid solution not added with hydrogen peroxide ($H_2O_2$) as the electrolytic solution EL and when a voltage was applied so that a current of 2.2 A flows to the electrode plate 610 and the wafer through the electrolytic solution EL.

When using the hydrogen peroxide for an oxidant, aqueous copper ions ($[Cu(OH)_4]^{2-}$) are formed. The aqueous copper ions are chelated by the chelating agent in the electrolytic solution EL. For example, when the chelating agent is a quinaldine acid, a chelate film of the chemical formula (6) is formed. When glycin is used, a chelate film of the chemical formula (7) is formed.

The other experimental conditions include using an eight-inch wafer, a 25 nm thick Ta as the barrier metal, a 1200 nm-thick TEOS (tetraethyl orthosilicate) film for the interlayer insulation film, and a 1600 nm thick copper film.

Figure 22A:
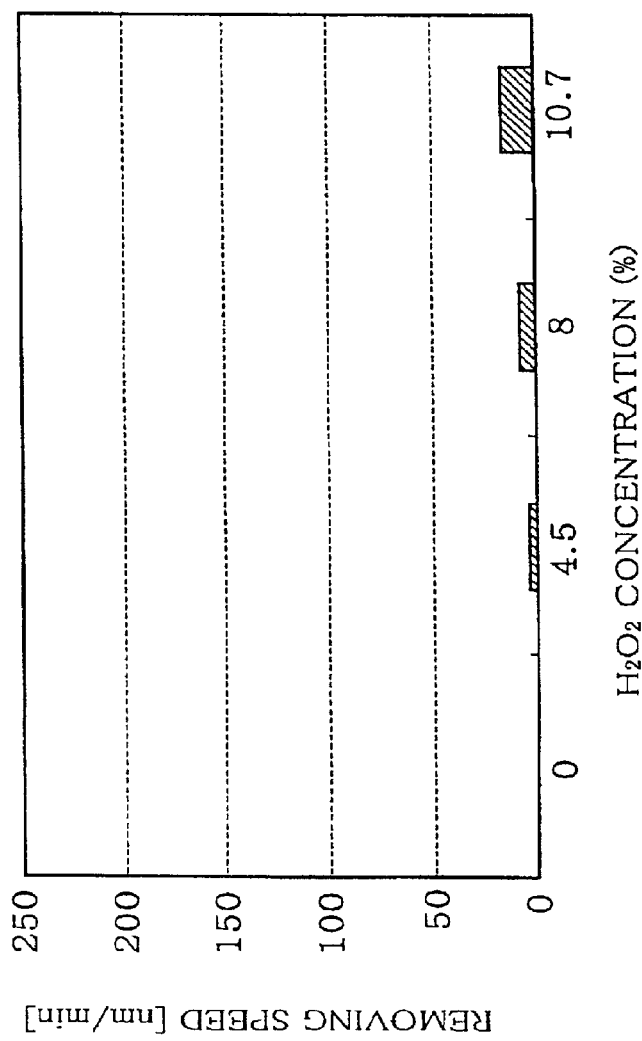

In FIG. 22, it is clear that the amount of copper film removed per unit time increased because the amount of the chelate film produced by copper film oxidation increases with an increased amount of the hydrogen peroxide serving as an oxidant, but when using the polishing method by the polishing apparatus according to the third embodiment of the present invention, without adding the hydrogen peroxide and by only the anodic oxidation caused by current conducting to produce a chelate film, it is shown the removal rate is raised greatly in comparison with that caused by an oxidant.

Sixth Embodiment

Figure 23:
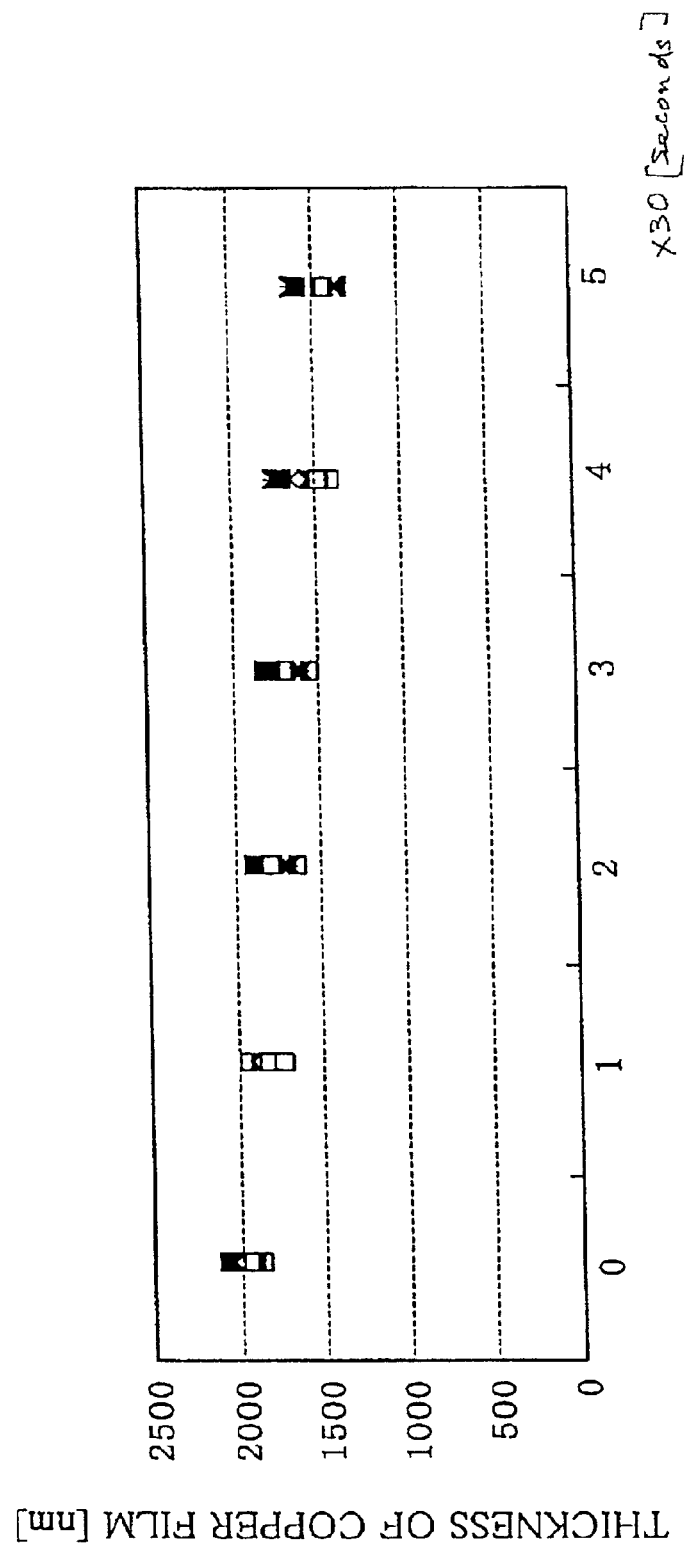
FIG. 23 shows measurement results in a sixth embodiment.

FIG. 23 is a view of the measured thickness of a copper film after a chelate film is removed when a current of 2.2 A is supplied for 30 seconds each time using a copper film for an anode to remove the chelate film.

The measurements were made at 21 points on an eight-inch wafer with the wafer divided into 21 parts along a diameter direction. The first and the 21st points were 6 mm apart from the edge of the wafer, respectively.

In addition, a quinaldine acid solution was used for an electrolytic solution. The thickness of the copper film was 2000 nm. A 25 nm thick Ta was used for the barrier metal. Use was made of a wafer having a 1200 nm thick TEOS film used for the interlayer insulation film below the barrier metal.

In FIG. 23, numbers 0, 1, 2, 3, 4, 5 along the horizontal axis indicate the times of the 30-second conduction of a 2.2 A current. Therefore, 0 means no current is conducted, 1 means conduction of a 2.2 A current for 30 seconds, 2 for total 60 seconds, 3 for a total 90 seconds, 4 for a total 120 seconds, and 5 for a total 150 seconds.

The vertical axis indicates the thickness (nm) of the residual copper on the surface of the wafer after the copper removing process by current conduction.

The measurements were repeated several times under the same conditions.

It is shown from the results that each time a current is conducted for a specific time period, the thickness of the residual copper after the copper removing process decreases corresponding to the time period of current conduction. The average removal rate was 202.68 nm per minute.

Seventh Embodiment

Figure 24:
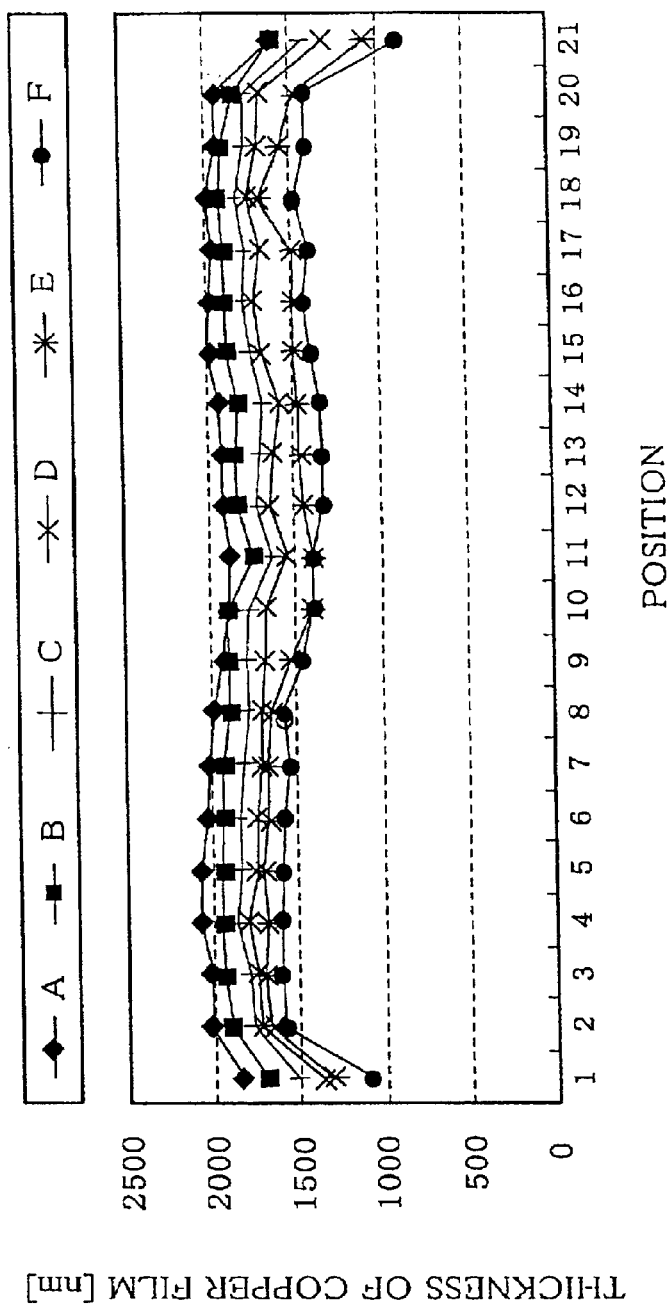
FIG. 24 shows measurement results in a seventh embodiment.
Figure 25A:
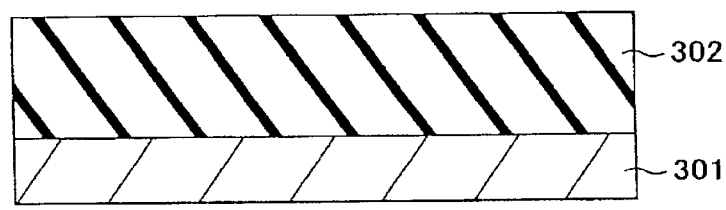
FIG. 25A to 25C are sectional views of steps of the method of formation of copper interconnections by a dual damascene process according to an example of the related art, where
Figure 25B:
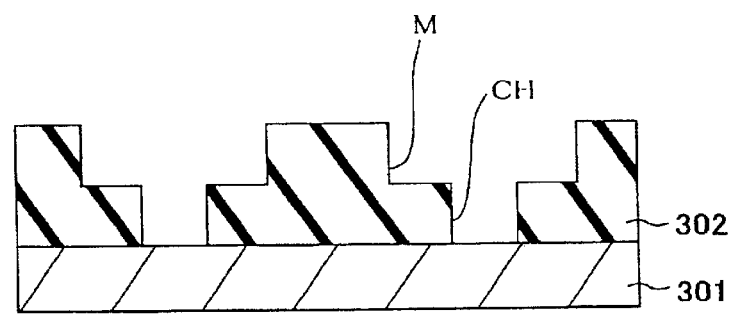
Figure 25C:
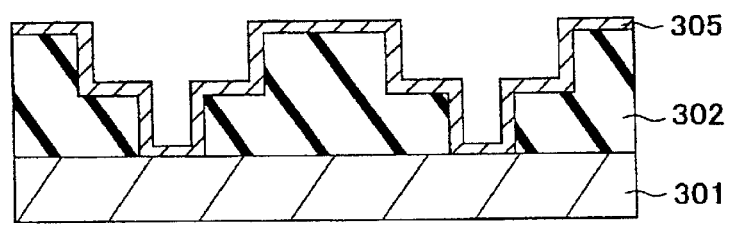
Figure 26A:
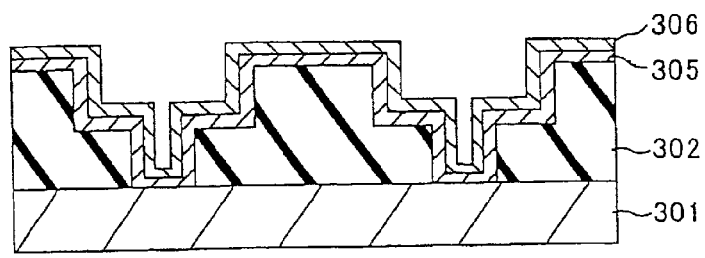
FIG. 26A to 26C are views of the steps continuing from FIG. 25A to 25C, where
Figure 26B:
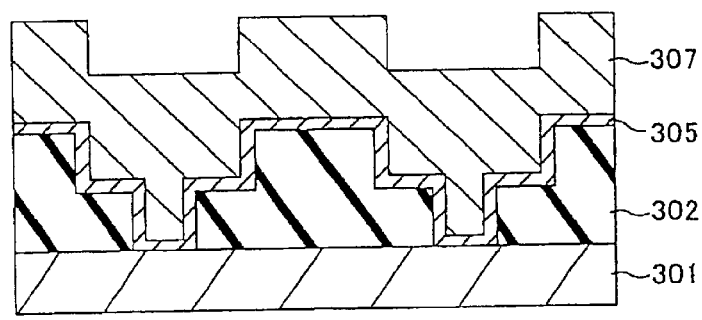
Figure 26C:
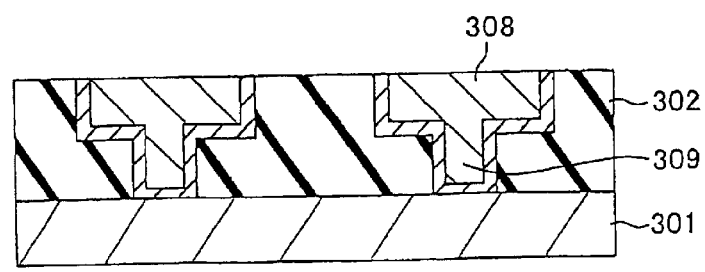
Figure 27:
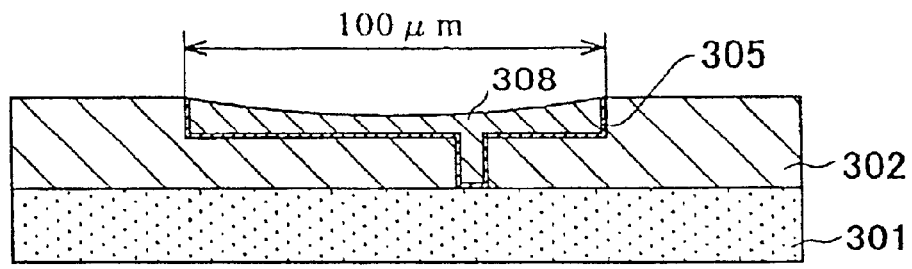
FIG. 27 is a sectional view for explaining dishing occurring in polishing of a copper film by CMP.
Figure 28:
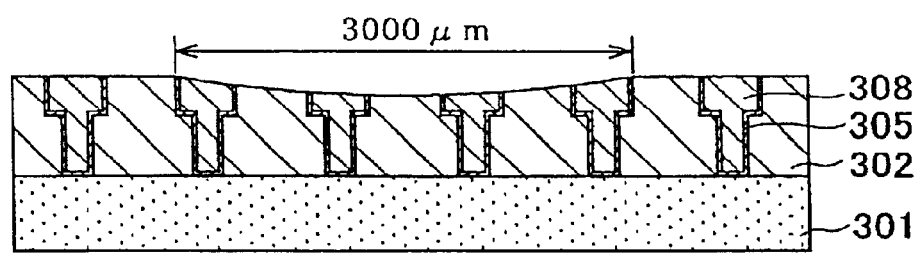
FIG. 28 is a sectional view for explaining erosion occurring in polishing of a copper film by CMP.
Figure 29:
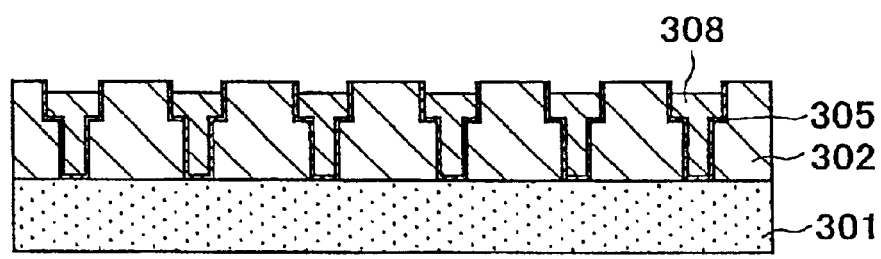
FIG. 29 is a sectional view for explaining a recess occurring in polishing of a copper film by CMP.
Figure 30:
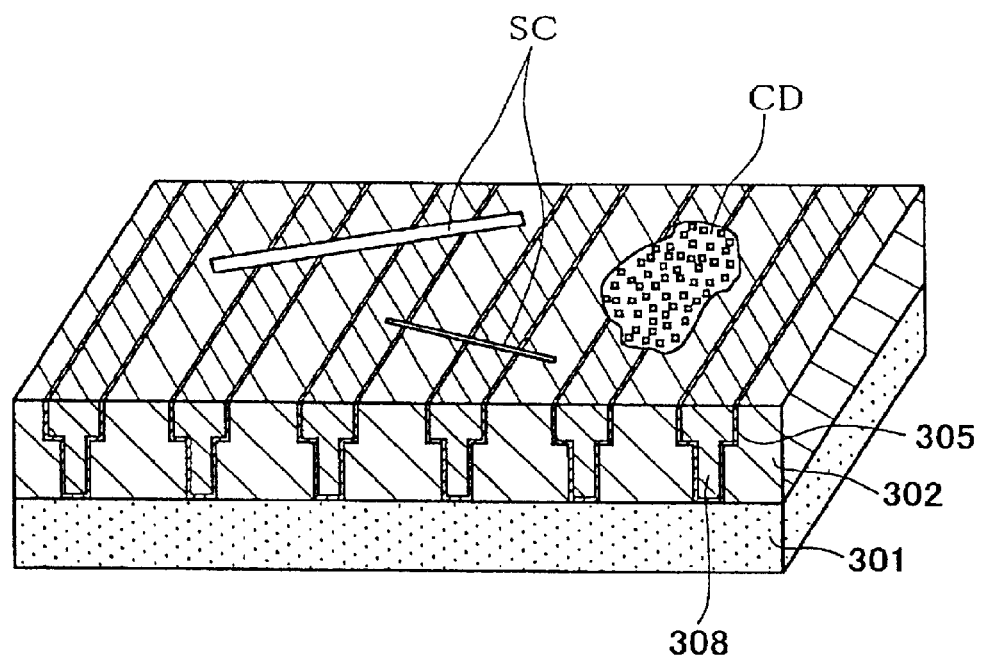
FIG. 30 is a sectional view for explaining a scratch SC and chemical damage CD occurring in polishing of a metal film by CMP.

FIG. 24 shows the results of similar measurements as those in FIG. 23 made at 21 points on an eight-inch wafer with the wafer divided into 21 parts along a diameter direction.

The current and the conduction time are the same as the sixth embodiment. Measurements were made of the thickness of the residual copper after the process of removing the copper film in a case where 30 second conduction of a 2.2 A current was repeated several times.

Other conditions such as the wafer in use, the type of the electrolytic solution, etc. are the same as the second embodiment.

In FIG. 24, the numbers 1 to 21 along the horizontal axis represent the aforethe positions on the wafer, while the vertical axis represents the thickness (nm) of the residual copper after the removal. Specifically, A, B, C, D, E, F represent the thickness (nm) of the residual copper after the removal after conduction of a 2.2 A current for a total of 0 second, 30 seconds, 60 seconds, 90 seconds, 120 seconds, and 150 seconds respectively at each and every point described above.

According to the present embodiment, the thickness of the copper film at each and every point decreases approximately linearly depending on the product of the current and the time. Note that the smaller thicknesses of the copper film at the first and the 21st point are due to the plating characteristics during the preceding step for forming the copper film and are irrelevant to the polishing method of the present invention.

Summarizing the effects of the present invention, according to the method for producing a semiconductor device using the polishing method of the present invention, since the copper film is polished by the composite actions of mechanical polishing and electrolytic polishing, in comparison with the case of the flattening of the copper film by mechanical polishing, very highly efficient selective removal and flattening of the projecting portions of the copper film become possible.

Further, according to the method for producing a semiconductor device using the polishing method of the present invention, since a sufficient polishing rate is obtained even with a relatively low polishing pressure, the occurrence of scratches, dishing, or erosion in the polished metal film can be suppressed. In addition, since damage to an interlayer insulation film below a copper film can be suppressed, even in the case where an organic low dielectric constant film or porous low dielectric constant insulation film having a relatively low mechanical strength is used as the interlayer insulation film in order to reduce the dielectric constant from the viewpoint of lowering the power consumption and increasing the speed of the semiconductor device, the invention can be easily applied.

Further, according to the method for producing a semiconductor device using the polishing method of the present invention, by monitoring the electrolytic current, the polishing process can be controlled, so it becomes possible to correctly grasp the state of progress of the polishing process.

According to the polishing apparatus of the present invention, since the metal film is polished by the composite actions of mechanical polishing and electrolytic polishing, in comparison with the case of the flattening of the metal film by mechanical polishing, very highly efficient selective removal and flattening of the projecting portions of the metal film become possible.

Further, according to the polishing apparatus of the present invention, since a sufficient polishing rate is obtained even with a relatively low polishing pressure, the occurrence of scratches, dishing, or erosion in the polished metal film can be suppressed. In addition, since damage to an interlayer insulation film below a copper film can be suppressed, even in the case where an organic low dielectric constant film or porous low dielectric constant insulation film having a relatively low mechanical strength is used as the interlayer insulation film in order to reduce the dielectric constant from the viewpoint of lowering the power consumption and increasing the speed of the semiconductor device, the invention can be easily applied.

Further, according to the polishing apparatus of the present invention, by monitoring the electrolytic current, the polishing process can be controlled, so it becomes possible to correctly grasp the state of progress of the polishing process.

Further, according to the polishing apparatus of the present invention, because the configuration of the apparatus is simple, reduction of its size can be easily realized, maintenance is easy, and the operation rate can be improved.

While the invention has been described with reference to specific embodiments chosen for purpose of illustration, it should be apparent that numerous modifications could be made thereto by those skilled in the art without departing from the basic concept and scope of the invention.

What is claimed is:

1. A method for production of a semiconductor device, comprising the steps of:
   forming at least a groove or hole in an insulation film formed on a substrate;
   stacking a metal film on said insulation film so as to bury the groove or hole;
   interposing an electrolytic solution between an electrode member and the metal film;
   oxidizing the surface of the metal film through an anode oxidation process;
   forming a chelate film of oxidized copper on the oxidated metal film;
   removing the chelate film from the surface of the metal film, wherein said chelate film is removed by wiping or mechanical polishing and the chelate film is wiped by a wiping member having an air hole; and
   selectively repeating the above step of removing the chelate film until the unevenness of the surface of the metal film is reduced.

2. A method for producing a semiconductor device as set forth in claim 1, wherein said insulation film comprises a silicon dioxide film.

3. A method for producing a semiconductor device as set forth in claim 1, wherein said insulation film comprises a silicon nitride film.

4. A method for producing a semiconductor device as set forth in claim 1, wherein
   in said step of forming at least a groove or hole in an insulation film, either a groove or a hole is formed and
   in said step of stacking a metal film on said insulation film, either the groove or the hole is buried.

5. A method for producing a semiconductor device as set forth in claim 1, wherein
   in said step of forming at least a groove or hole in an insulation film, the hole is in communication with the bottom surface of the groove; and
   in said step of stacking a metal film on said insulation film, both the groove and the hole are buried.

6. A method for producing a semiconductor device as set forth in claim 1, wherein in said step of stacking a metal film on said insulation film, at least one of Al, W, WN, Cu, Au, and Ag or an alloy of the same is stacked by either a chemical vapor-phase growing process or a physical vapor-phase growing process.

7. A method for producing a semiconductor device as set forth in claim 1, wherein in said step of stacking a metal film on said insulation film, at least one of Cu, Au, and Ag or an alloy of the same is stacked by an electroplating process.

8. A method for producing a semiconductor device as set forth in claim 1, wherein in said step of stacking a metal film on said insulation film, at least one of Co, Ni, CoWP, Cu, Au, and Ag or an alloy of the same is stacked by an electroless plating process.

9. A method for producing a semiconductor device as set forth in claim 1, wherein in said step of wiping the surface of the chelate film, the surface of the chelate film is wiped by a wiping member comprising an elastic material.

10. A method for producing a semiconductor device as set forth in claim 1, wherein in said step of removing the surface of said chelate film, the step of chelate film removal is repeated until the metal film stacked outside said groove or hole is removed.

11. A method for producing a semiconductor device as set forth in claim 1, wherein in said oxidation step of and said step of removing surface of the chelate film, the surface of the oxidized metal film is removed in a state of applying a predetermined voltage between the electrode member and the oxidized metal film.

12. A method for producing a semiconductor device as set forth in claim 1, wherein in said oxidizing step and said step of removing the surface of the chelate film, the surface of the chelate film is removed after a predetermined time period after applying a predetermined voltage between the electrode member and the metal film.

13. A method for producing a semiconductor device as set forth in claim 1, wherein said insulation film comprises an insulation film having a dielectric constant less than a silicon dioxide film.

14. A method for producing a semiconductor device as set forth in claim 13, wherein said insulation film having a dielectric constant less than a silicon dioxide film comprises SiF, SiOCH, polyarylether, porous silica, or polyimide.

15. A method for producing a semiconductor device as set forth in claim 1, wherein in said step of interposing an electrolytic solution between said electrode member and said metal film, an electrolytic solution including an electrolyte and an additive is interposed.

16. A method for producing a semiconductor device as set forth in claim 15, wherein said electrolytic solution comprises copper ions.

17. A method for producing a semiconductor device as set forth in claim 15, wherein said electrolytic solution comprises at least a brightener or a chelating agent as said additive.

18. A method for producing a semiconductor device as set forth in claim 1, wherein in said oxidizing step periodical pulse-like voltage is applied between the electrode member and the metal film.

19. A method for producing a semiconductor device as set forth in claim 18, wherein said applied periodical pulse-like voltage has a rectangular, sinusoidal, sawtooth wave, or PAM waveform.

20. A method for producing a semiconductor device as set forth in claim 18, wherein in said oxidizing step of a periodical pulse-like voltage is applied so that the current flowing through the cathode member and the metal film becomes small near the end of the process of removing the metal film.

21. A method for producing a semiconductor device as set forth in claim 18, wherein in said oxidizing step a periodical pulse-like voltage is applied so that the current flowing through the electrode member and the metal film changes in a step-like manner.

22. A method for producing a semiconductor device as set forth in claim 18, wherein in said oxidizing step a periodical pulse-like voltage is applied so that the current flowing through the electrode member and the metal film rises gradually at the beginning of the process of removing the metal film.

23. A method for producing a semiconductor device as set forth in claim 1, wherein said step of interposing an electrolytic solution between said electrode member and said metal film further includes a step of adjusting the electrolytic solution to a predetermined temperature.

24. A method for producing a semiconductor device as set forth in claim 23, wherein in said step of adjusting said electrolytic solution to a predetermined temperature, the temperature of the electrolytic solution is adjusted below 80° C.

25. A method for producing a semiconductor device as set forth in claim 1, further comprising a step of forming a barrier film for preventing diffusion of said metal film to said insulation film on the insulation film so as to bury said groove or hole after forming the groove or hole in the insulation film and before stacking the metal film on said insulation film,
wherein said metal film is stacked on the barrier film in the step of stacking the metal film on said insulation film.

26. A method for producing a semiconductor device as set forth in claim 25, wherein in said step of stacking said barrier film on said insulation film, at least one of Ti, TiN, Ta, TaN, W, WN, Go, CoWP, TiSiN, and NiWP or a stacked structure of the same is stacked.

* * * * *

UNITED STATES PATENT AND TRADEMARK OFFICE
CERTIFICATE OF CORRECTION

PATENT NO.   : 6,797,623 B2
DATED        : September 28, 2004
INVENTOR(S)  : Shuzo Sato It is certified that error appears in the above-identified patent and that said Letters Patent is hereby corrected as shown below:

Column 36,
Line 51, replace "Go" with -- Co --.

Signed and Sealed this

Twenty-seventh Day of September, 2005

JON W. DUDAS
*Director of the United States Patent and Trademark Office*